(12) United States Patent
Chen et al.

(10) Patent No.: US 10,163,807 B2
(45) Date of Patent: Dec. 25, 2018

(54) ALIGNMENT PATTERN FOR PACKAGE SINGULATION

(71) Applicant: Taiwan Semiconductor Manufacturing Company, Ltd., Hsinchu (TW)

(72) Inventors: Ying-Ju Chen, Tuku Township (TW); Der-Chyang Yeh, Hsinchu (TW); Hsien-Wei Chen, Hsinchu (TW); Shih-Peng Tai, Xinpu Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/640,975

(22) Filed: Jul. 3, 2017

(65) Prior Publication Data

US 2018/0151507 A1    May 31, 2018

Related U.S. Application Data

(60) Provisional application No. 62/427,807, filed on Nov. 29, 2016.

(51) Int. Cl.
*H01L 23/544* (2006.01)
*B81C 99/00* (2010.01)
(Continued)

(52) U.S. Cl.
CPC .......... *H01L 23/544* (2013.01); *B81C 99/007* (2013.01); *H01L 21/56* (2013.01); *H01L 21/561* (2013.01); *H01L 21/565* (2013.01); *H01L 21/681* (2013.01); *H01L 21/6835* (2013.01); *H01L 21/6836* (2013.01); (Continued)

(58) Field of Classification Search
CPC ..... H01L 2224/0213; H01L 2224/0217; H01L 2224/0224; H01L 23/544; H01L 2223/54426; B81C 99/007
See application file for complete search history.

(56) References Cited

U.S. PATENT DOCUMENTS

2005/0009302 A1\* 1/2005 Wakui .................... H01L 21/78
                                                                  438/464
2013/0187270 A1\* 7/2013 Yu ........................ H01L 23/5389
                                                                  257/737

(Continued)

*Primary Examiner* — Selim Ahmed
*Assistant Examiner* — Evan Clinton
(74) *Attorney, Agent, or Firm* — Slater Matsil, LLP

(57) ABSTRACT

A method includes forming an alignment pattern over an insulating layer formed over a carrier. A die is mounted over the carrier and encapsulated. Connectors are formed and the structure is attached to a debond tape. The carrier is removed. A cutting device is aligned to a backside of the insulating layer using the alignment pattern. The first insulating layer and encapsulant are cut from the backside of the insulating layer. Another method includes scanning a backside of a packages structure for an alignment pattern in a first package area of the packages structure. A cutting device is aligned to a cut-line in a non-package area of the packages structure based on the alignment pattern and packages are singulated. An InFO package includes an insulating layer on the backside, the insulating layer having a laser marking thereon. The InFO package also includes an alignment pattern proximate to the insulating layer.

20 Claims, 26 Drawing Sheets

(51) Int. Cl.
  H01L 21/56      (2006.01)
  H01L 21/68      (2006.01)
  H01L 21/683     (2006.01)
  H01L 21/78      (2006.01)
  H01L 23/31      (2006.01)
  H01L 23/538     (2006.01)
  H01L 23/58      (2006.01)
  H01L 23/00      (2006.01)
  H01L 25/065     (2006.01)

(52) U.S. Cl.
  CPC .......... *H01L 21/78* (2013.01); *H01L 23/3107* (2013.01); *H01L 23/3128* (2013.01); *H01L 23/5386* (2013.01); *H01L 23/5389* (2013.01); *H01L 23/585* (2013.01); *H01L 24/11* (2013.01); *H01L 24/13* (2013.01); *H01L 24/19* (2013.01); *H01L 24/20* (2013.01); *H01L 24/96* (2013.01); *H01L 25/0655* (2013.01); H01L 21/568 (2013.01); H01L 24/32 (2013.01); H01L 2221/68327 (2013.01); H01L 2221/68331 (2013.01); H01L 2221/68359 (2013.01); H01L 2221/68372 (2013.01); H01L 2221/68381 (2013.01); H01L 2223/5442 (2013.01); H01L 2223/54406 (2013.01); H01L 2223/54426 (2013.01); H01L 2223/54433 (2013.01); H01L 2223/54486 (2013.01); H01L 2224/0231 (2013.01); H01L 2224/0239 (2013.01); H01L 2224/02379 (2013.01); H01L 2224/0345 (2013.01); H01L 2224/0362 (2013.01); H01L 2224/03462 (2013.01); H01L 2224/03464 (2013.01); H01L 2224/03614 (2013.01); H01L 2224/0401 (2013.01); H01L 2224/05147 (2013.01); H01L 2224/05166 (2013.01); H01L 2224/11002 (2013.01); H01L 2224/1146 (2013.01); H01L 2224/11849 (2013.01); H01L 2224/12105 (2013.01); H01L 2224/13024 (2013.01); H01L 2224/13109 (2013.01); H01L 2224/13111 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/13164 (2013.01); H01L 2224/215 (2013.01); H01L 2224/32225 (2013.01); H01L 2924/01013 (2013.01); H01L 2924/01022 (2013.01); H01L 2924/01029 (2013.01); H01L 2924/01074 (2013.01)

(56) References Cited

U.S. PATENT DOCUMENTS

2014/0093157 A1* 4/2014 McGarry ............. G06T 7/0004
                                              382/149
2015/0348904 A1* 12/2015 Huang ............. H01L 21/76802
                                              257/774
2015/0371915 A1* 12/2015 Hashimoto ........... H01L 23/562
                                              257/531
2015/0380357 A1* 12/2015 Liu ...................... H01L 23/544
                                              257/737

* cited by examiner

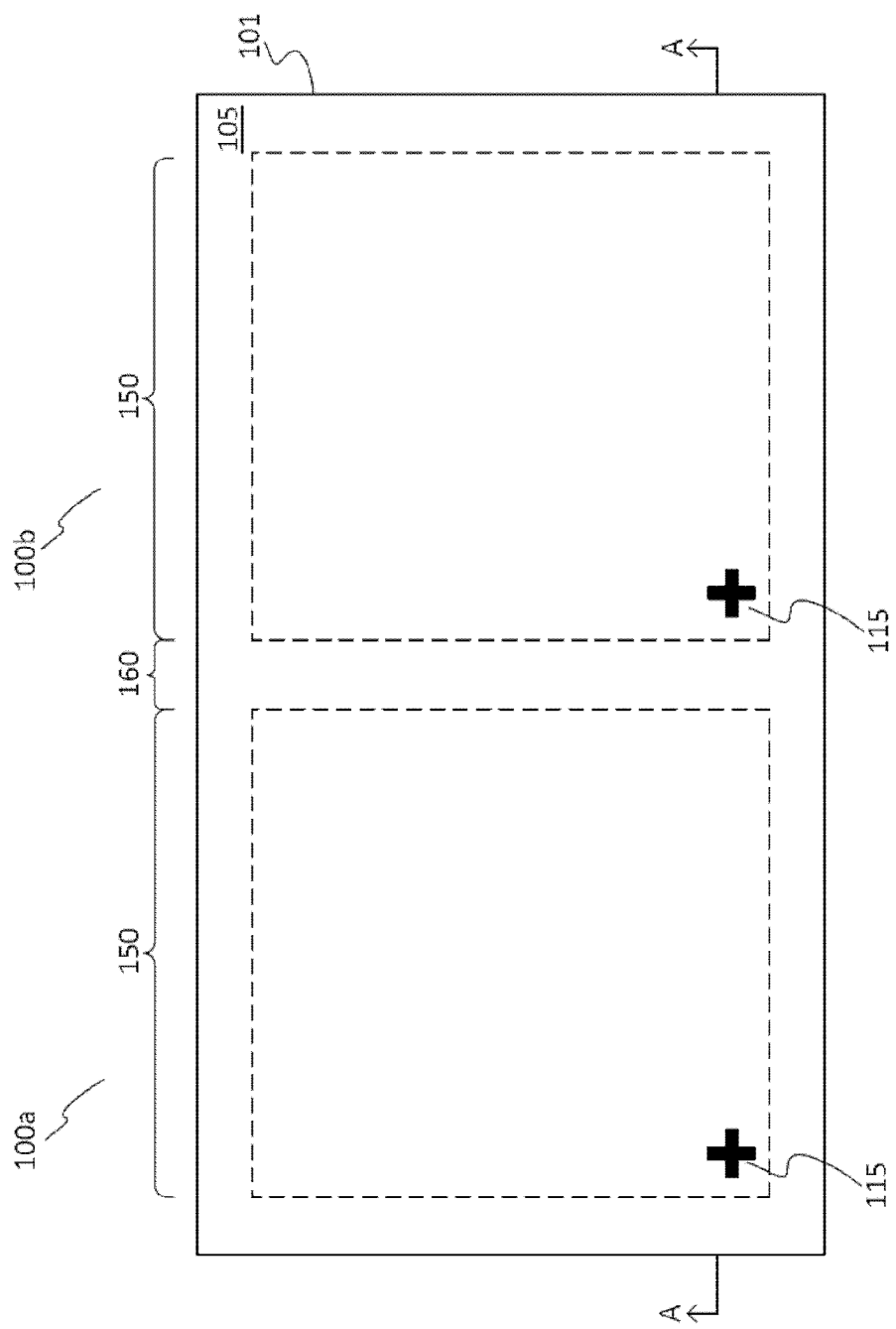

ALIGNMENT PATTERN FOR PACKAGE SINGULATION

PRIORITY CLAIM AND CROSS-REFERENCE

This application claims the benefit of U.S. Provisional Application No. 62/427,807, filed on Nov. 29, 2016, and entitled "Pattern for Integrated Fan Out Saw Process," which application is hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
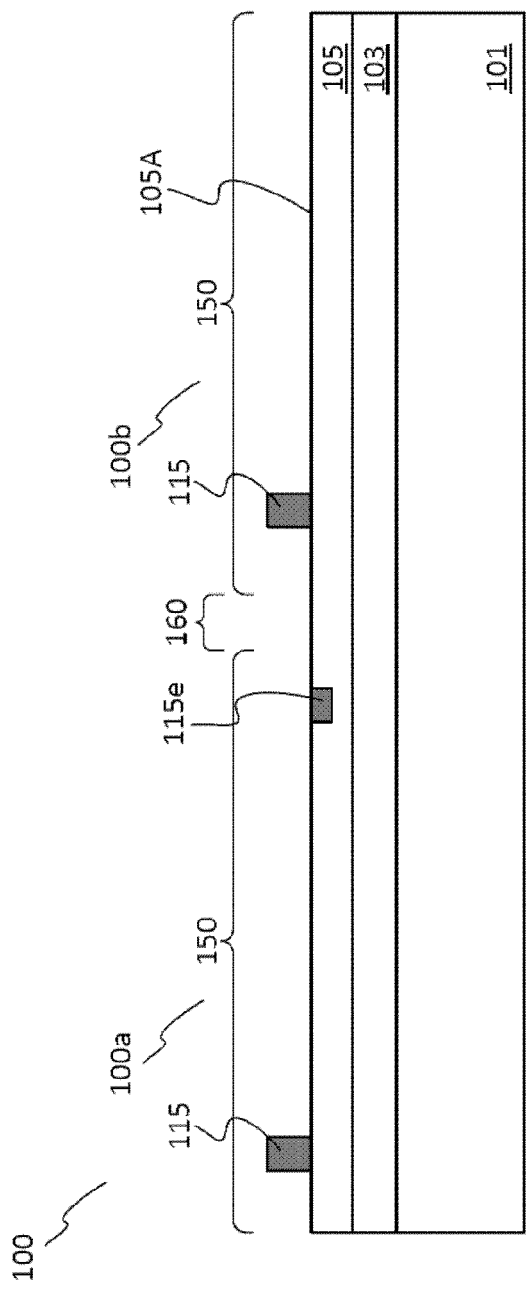
FIGS. 1a-10c illustrates various stages of forming integrated fan out (InFO) packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In packaged device manufacturing, dies or devices can be formed or placed on a carrier. A molding compound can be deposited over the dies or devices. A redistribution layer (RDL) structure can be formed over the devices and provide interconnects to the dies or devices. A contact pad layer can provide contact pads on a front surface of the packaged device. The contact pads can feature a connector, such as a solder ball or conductive pillar, disposed thereon for connection to another device, interposer, or the like. The front side of the package can be considered the side with the contact pads and the back side of the package can be considered the side of the package that is mounted to the carrier. The package can feature logic dies, memory dies, or a combination thereof. The dies can include for example, a dynamic random access memory (DRAM) die and a system-on-chip (SoC) die. Other dies and devices can be used as well. The RDL structure can provide an integrated fan out (InFO) connection to the dies, thereby internally routing signals between dies, between connectors of a single die, and between dies and one or more external contact pads. After the packaged devices are formed on the carrier, they are singulated into individual packages.

Embodiments, such as those discussed herein, provide singulation of a packaged semiconductor device, such as an integrated fan out (InFO) package. A plurality of InFO packages can be developed and formed on a carrier substrate, such as a carrier substrate wafer. An InFO package or multiple InFO packages can be formed on a front side of the carrier. The InFO package can include a backside alignment pattern to provide an alignment identifier for a saw or other cutting device for singulation of the InFO packages. After the package is created on the carrier, external connectors (e.g., a ball grid array (BGA)) are formed, debond tape can be attached to the external connectors, and the carrier can be removed. The packages can be laser marked on their backsides. Then the device can be singulated from the backside. The alignment pattern can be detected on the backside by an alignment detection device. The alignment detection device can align the saw or other cutting device and the cutting device can singulate the InFO package or multiple InFO packages by cutting the backside of the InFO packages.

FIGS. 1a through 10c illustrate cross-sectional views of intermediate steps in forming a die package 100 in accordance with some embodiments. FIGS. 1a, 2a, 3a, 4a, and 10a illustrate embodiments where an alignment pattern is embedded in an encapsulant. FIGS. 1b, 2b, 3b, 4b, and 10b illustrate embodiments where an alignment pattern is in a layer along with an insulating material and optional conductive features and/or a seal ring. FIGS. 1c, 2c, 3c, 4c, and 10c illustrate embodiments where an alignment pattern is in a layer along with an insulating material, while optional conductive features and/or a seal ring are in a separate adjacent layer. FIGS. 5-9 illustrate embodiments such as those consistent with FIG. 1b, however, the features discussed therein can readily be applied to the other illustrated embodiments. These embodiments are explained in detail below.

FIG. 1a includes a group of packages, such as package 100a and 100b, which includes a glue layer 103 formed over a carrier substrate 101, a first insulating layer 105 formed over the glue layer 103, and alignment pattern 115 formed over the first insulating layer 105.

The carrier substrate 101 may be a wafer including glass, silicon (e.g., a silicon wafer), silicon oxide, aluminum oxide, metal plate, a ceramic material, an organic material, or the like. In some embodiments, the carrier 101 can be a tape. The carrier substrate 101 includes package regions 150 and non-package regions 160. Packages, such as package 100a and 100b, are formed in the package regions 150. Package regions 150 include design areas for forming features of the packages, including features such as one or more die mounting areas, fan-out redistribution layer(s), metal lines, a connector array, and so forth.

Non-package regions 160 are reserved for dicing streets or scribe lines for package singulation. Non-package regions 160 are free from design features, such as metal lines and devices. After formation of the packages 100, the packages 100 can be separated into, for example package 100a and 100b, by cutting the packages apart through the dicing streets. It should be understood that, although packages 100a and 100b are specifically illustrated, the group of packages 100 can comprise additional packages formed on carrier 101. Additional packages can each be identical to one another, different from one another, or a combination thereof.

Referring to FIG. 1a, the adhesive layer 103 is disposed on the carrier substrate 101 in order to assist in the adherence of overlying structures, for example, the first insulating layer 105 to the carrier substrate 101. In later steps, the adhesive layer 103 also aids in the debonding of the carrier 101 from the packages. In some embodiments, the adhesive layer 103 can include an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 can be placed onto the first carrier substrate 101 in a semi-liquid or gel form, which is readily deformable under pressure.

A first insulating layer 105 is disposed over the adhesive layer 103. The first insulating layer 105 is placed over the adhesive layer 103 and is utilized in order to provide protection to the package, e.g., once completed, the underlying devices and structures of the package. The first insulating layer 105 also provides a surface on which manufacturer marking can occur, to mark the package with information, such as identification or manufacturing information. In an embodiment the first insulating layer 105 may be a polymer such as polybenzoxazole (PBO), although any suitable material, such as polyimide, a polyimide derivative, benzocycloutene (BCB), or an epoxy, may alternatively be utilized. The first insulating layer 105 may be placed using, e.g., a spin-coating process to a thickness of between about 0.5 μm and about 10 μm, such as about 5 μm, although any suitable method and thickness may alternatively be used. The first insulating layer 105 can be transparent or translucent. In some embodiments, the first insulating layer 105 can be colored.

An alignment pattern 115 is disposed over the first insulating layer 105. In some embodiments, alignment pattern 115 is formed on a front side 105A of the first insulating layer 105. In some embodiments, the alignment pattern 115 is made of conductive material. In some embodiments, the alignment pattern 115 is a dummy structure which is electrically decoupled or electrically isolated from any of the subsequently formed conductive elements. In other embodiments, the alignment pattern 115 can be electrically and/or physically coupled to subsequently bonded dies or other conductive elements, such as metal lines, traces, or electrical connectors.

In some embodiments, the alignment pattern 115 is formed by depositing a seed layer over the first insulating layer 105. The seed layer (not shown) can be made of copper (Cu), tungsten (W), gold (Au), silver (Ag), aluminum, (Al), lead (Pb), tin (Sn), alloys of the same, or the like. A sacrificial layer, such as a photoresist, is deposited over the seed layer and patterned to form openings therein according to the layout of the alignment pattern 115. Generally, photolithography techniques involve depositing a photoresist material (not shown), which is subsequently irradiated (exposed) and developed to remove a portion of the photoresist material. The remaining photoresist material prevents the formation of other materials thereon, such as the conductive material of alignment pattern 115.

Conductive material is deposited in the openings over the seed layer. The conductive material may be formed by plating, such as electroplating or electroless plating, or the like. In an embodiment, the conductive material of the alignment pattern 115 is copper (Cu), tungsten (W), gold (Au), silver (Ag), aluminum, (Al), lead (Pb), tin (Sn), alloys of the same, or the like. Subsequently, the photoresist is removed, for example by an ashing technique, and the exposed seedlayer is stripped using a suitable etchant.

In another embodiment, the alignment pattern 115 is formed by depositing conductive material over the first insulating material 105, for example, by CVD, ALD, PVD, the like, or a combination thereof. A photoresist is deposited over the conductive material and patterned using photolithography techniques to form openings where the conductive material will be removed. The remaining photoresist material protects the underlying material, such as the conductive material of alignment pattern 115 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the alignment pattern 115. Subsequently, the photoresist material may be removed using, for example, an ashing process followed by a wet clean process.

In some embodiments, the alignment pattern 115 is made of a non-conductive material, such as an insulating material, including a polymer or dielectric. In such embodiments, the insulating material should be visibly different than first insulating layer 105 and any overlying structures such that a visible difference can be distinguished between the non-conductive alignment pattern 115 and overlying layers when viewed from the back side. In some embodiments, the alignment pattern 115 can be formed and cured differently than other non-conductive material surrounding the alignment pattern such that the differently cured alignment pattern is distinguishable from the surrounding material. For example, curing the alignment pattern at 220° C. for 1 hour and the surrounding material at 190° C. for 3 hours (or vice versa) may provide alignment pattern 115 as distinguishable from the first insulating layer 105.

In an embodiment, non-conductive alignment pattern 115 may be a polymer, such as PBO, an epoxy, BCB, polyimide, or a polyimide derivative. The non-conductive alignment pattern 115 may be formed by depositing a second insulating layer, such as a polymer, using, e.g., a spin-coating process to a thickness of between about 5 µm and about 20 µm, such as about 10 µm and cured to result in a cured thickness of about 2 µm to about 10 µm, such as about 4 µm, although any suitable method and thickness may alternatively be used. In another embodiment, the second insulating layer may be another suitable dielectric such as silicon nitride, silicon carbide, silicon oxide, low-k dielectrics such as carbon doped oxides, extremely low-k dielectrics such as porous carbon doped silicon dioxide, or a combination thereof, although other relatively soft, often organic, dielectric materials can also be used. The second insulating layer may be deposited by chemical vapor deposition (CVD), physical vapor deposition (PVD), atomic layer deposition (ALD), a spin-on-dielectric process, the like, or a combination thereof.

Subsequently, the non-conductive alignment pattern 115 is formed from the second insulating layer using a photolithography process similar to the process described above, and is not repeated here. It should be noted, however, that in such embodiments, it may be desirable to form the second insulating layer from a material other than the material of the first insulating layer 105 to provide the ability to selectively etch the portions of the second insulating layer without damaging the first insulating layer 105. Alternatively, an etch stop layer (not shown) can be formed between the first insulating layer and the second insulating layer to prevent etching first insulating layer 105 when removing portions of the second insulating layer.

Referring to FIG. 1a, an embedded alignment pattern 115e is illustrated as being embedded in the first insulating layer, in accordance with some embodiments. The alignment pattern 115e is formed by making recesses or openings (not shown) in the first insulating layer 105. Such recesses may be formed to embed the alignment pattern 115e into the first insulating layer 105. The recesses may be formed, for example, by etching the first insulating layer 105 using a photolithography technique to form recesses or openings therein. In some embodiments where the alignment pattern 115e is a conductive material, a seed layer can be deposited in the recesses or openings and a second patterned photoresist can be formed (before or after removing the first photoresist) over the first insulating layer 105. The recesses or openings can then be plated, such as by electroplating or electroless plating, or the like to form the alignment pattern 115e. The photoresists are removed along with the exposed seed layer. In some embodiments where the alignment pattern 115e is a non-conductive material, a second insulating material can be deposited in the recesses or openings as part of a second insulating layer over the first insulating layer 105. In some embodiments, the second insulating layer can be patterned using photolithography techniques and excess portions removed by a suitable etchant. In some embodiments, the second insulating layer can be removed using a mechanical process, such as by CMP or grinding to remove the second insulating layer from the top of the first insulating layer 105, thereby leaving a portion of the second insulating layer in the recesses or openings in the first insulating layer 105 to form the alignment pattern 115e.

In some embodiments, an embedded alignment pattern 115e can be combined with other embodiments to form alignment patterns in different layers of the packages. Although the alignment pattern 115e is not specifically described in the other embodiments discussed below, it should be understood that forming an embedded alignment pattern 115e can also be performed in the other discussed embodiments below instead of, or in addition to, the alignment pattern 115 discussed below.

Figure 1B:
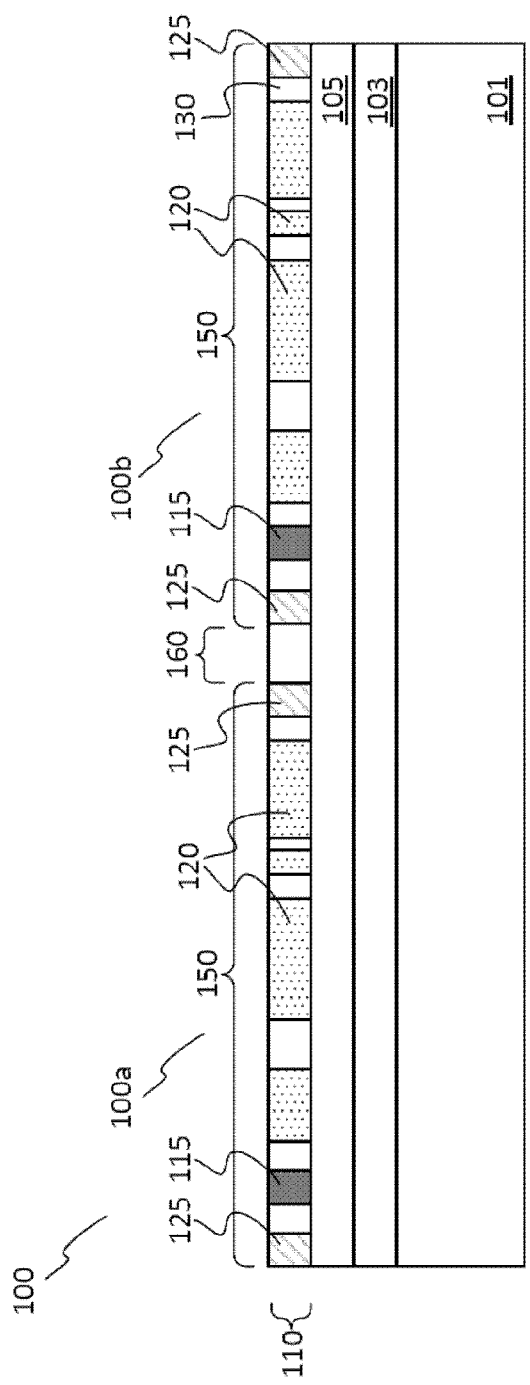

Referring to FIG. 1b, in some embodiments, additional conductive features 120 can be formed on the first insulating layer 105. The conductive features 120 can include traces, shields, conductive lines, contacts, contact pads, vias, and so forth in the package regions 150 of the packages 100. It should be understood that the conductive features 120 can be discontinuous and go in and out of the page. In some embodiments, the conductive features 120 can include a portion of a redistribution layer (RDL) structure or interconnect layer to provide interconnects between devices, pins, or contacts contained in the packaged device.

Still referring to FIG. 1b, in some embodiments, a seal ring structure 125 can be formed on the first insulating layer 105. In some embodiments, the conductive features 120 and seal ring 125 can be made at the same time and of the same materials as alignment pattern 115. As such, the alignment pattern 115, conductive features 120, and seal ring 125 can each have the same thickness. The process for making conductive features 120 and seal ring 125 is similar to the process for making the alignment pattern 115 and is not repeated.

The areas on the first insulating layer 105 which do not have an alignment pattern 115, conductive features 120, or seal ring 125 can be filled with a second insulating material 130 to create a second layer 110. In some embodiments, the second insulating material 130 can be added after the formation of the formation of the alignment pattern 115, conductive features 120, and seal ring 125. The second insulating material 130 can include a polymer, such as PBO, an epoxy, BCB, polyimide, or a polyimide derivative. The second insulating material 130 may be placed using, e.g., a spin-coating process to a thickness of between about 5 µm and about 20 µm, such as about 10 µm and cured to result in a cured thickness of about 2 µm to about 10 µm, such as about 4 µm, although any suitable method and thickness may alternatively be used. In another embodiment, second insulating material 130 may be a suitable dielectric such as silicon nitride, silicon carbide, silicon oxide, low-k dielectrics such as carbon doped oxides, extremely low-k dielectrics such as porous carbon doped silicon dioxide, or a combination thereof, although other relatively soft, often organic, dielectric materials can also be used. The second insulating material 130 may be deposited by chemical vapor deposition (CVD), physical vapor deposition (PVD), atomic layer deposition (ALD), a spin-on-dielectric process, the like, or a combination thereof.

In some embodiments, the alignment pattern 115, conductive features 120, and seal ring 125 can each be made of different materials in different processing steps. For example, the alignment pattern 115 can be made using a mask as described above with respect to FIG. 1a, and in a separate step another mask can be used to make conductive features 120 and/or seal ring 125. In some embodiments, alignment pattern 115 can be made of the same material as the seal ring 125. In some embodiments, the conductive features 120 and seal ring 125 can be made of the same material. The conductive features 120 and seal ring 125 are optionally included in the layer 110.

Figure 1C:
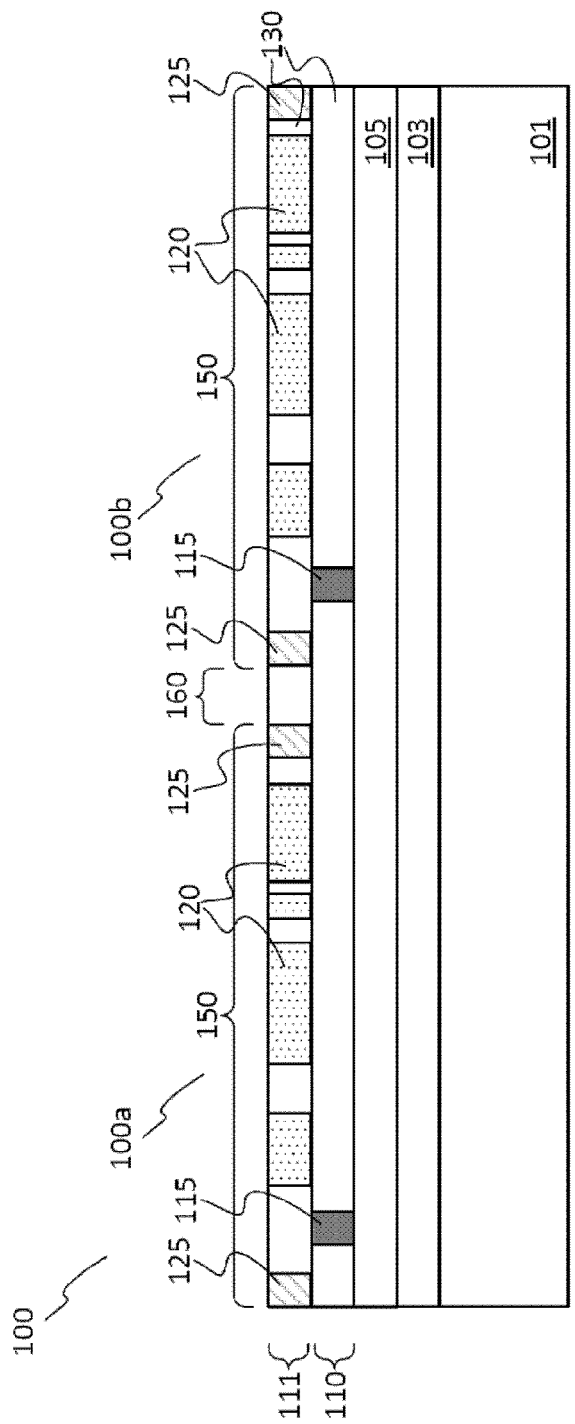

Referring to FIG. 1c, in some embodiments, conductive features 120 and seal ring 125 can be formed in or carried through in additional layers, such as layer 111 over the layer 110. In some embodiments, alternating insulating layers and conductive layers can be formed and patterned to form a backside redistribution layer (not shown). A process of forming a redistribution layer is further described below with reference to FIG. 4.

Second insulating material 130 can be included in layer 111 in areas of layer 111 which do not contain a seal ring 125 or conductive features 120. Second insulating material 130 of layer 111 (and other layers) can be formed in a manner consistent with that described above in relation to FIG. 1b and is not repeated.

In some embodiments, additional layers, such as layer 111 and subsequent layers can be included in the embodiments illustrated in FIGS. 1a and 1b. Referring to any of FIGS. 1a-1c, alignment pattern 115 can be formed in a subsequent layer. In other words, alignment pattern 115 need not be in the first layer over first insulating layer 105. For example, layer 111 and layer 110 (containing the alignment pattern 115) can be in reverse positions. In some embodiments alignment pattern 115 can be repeated in multiple layers, e.g., in both layer 110 and 111, and so forth.

Referring to any of FIGS. 1a-1c, alignment pattern 115 can be disposed within the package region 150 close to an edge of the package region 150. In some embodiments, alignment pattern 115 is disposed outside of a die mounting region (151 of FIG. 3) of the chip package device 100a/100b and not within any die mounting region, for example, outside die mounting region 151 between an edge of a die and seal ring 125.

FIG. 2a illustrates a plan view of a portion of the workpiece featured in FIG. 1a. The dashed box indicates the package region 150. Areas outside the dashed boxes indicate the non-package region 160. An alignment pattern 115 is located in each package region 150. The line AA indicates a cross section cut-line for FIG. 1a. Carrier 101 is under first insulating layer 105.

Figure 2B:
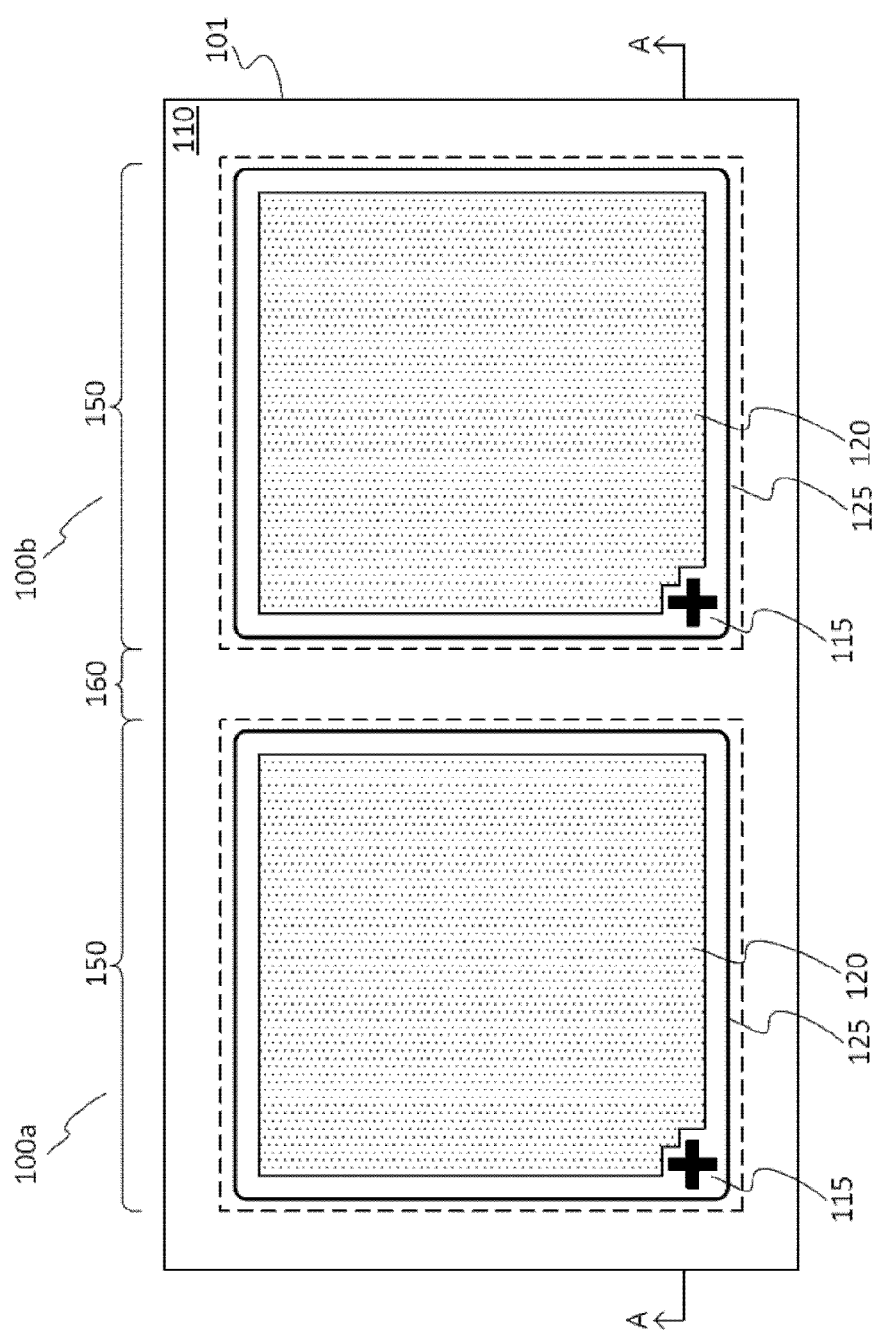

FIG. 2b illustrates a plan view of a portion of the workpiece featured in FIG. 1b. The dashed box indicates the package region 150. An alignment pattern 115 is located in each package region 150. Additional conductive features 120 are illustrated by the textured rectangular shape. As discussed above, the conductive features 120 block represents various lines that may be used for signal, power, and ground routing purposes. A seal ring 125 is formed around near the perimeter of the package region 150. The line AA indicates a cross section cut-line for FIG. 1b. Layer 110 is visible.

Figure 2C:
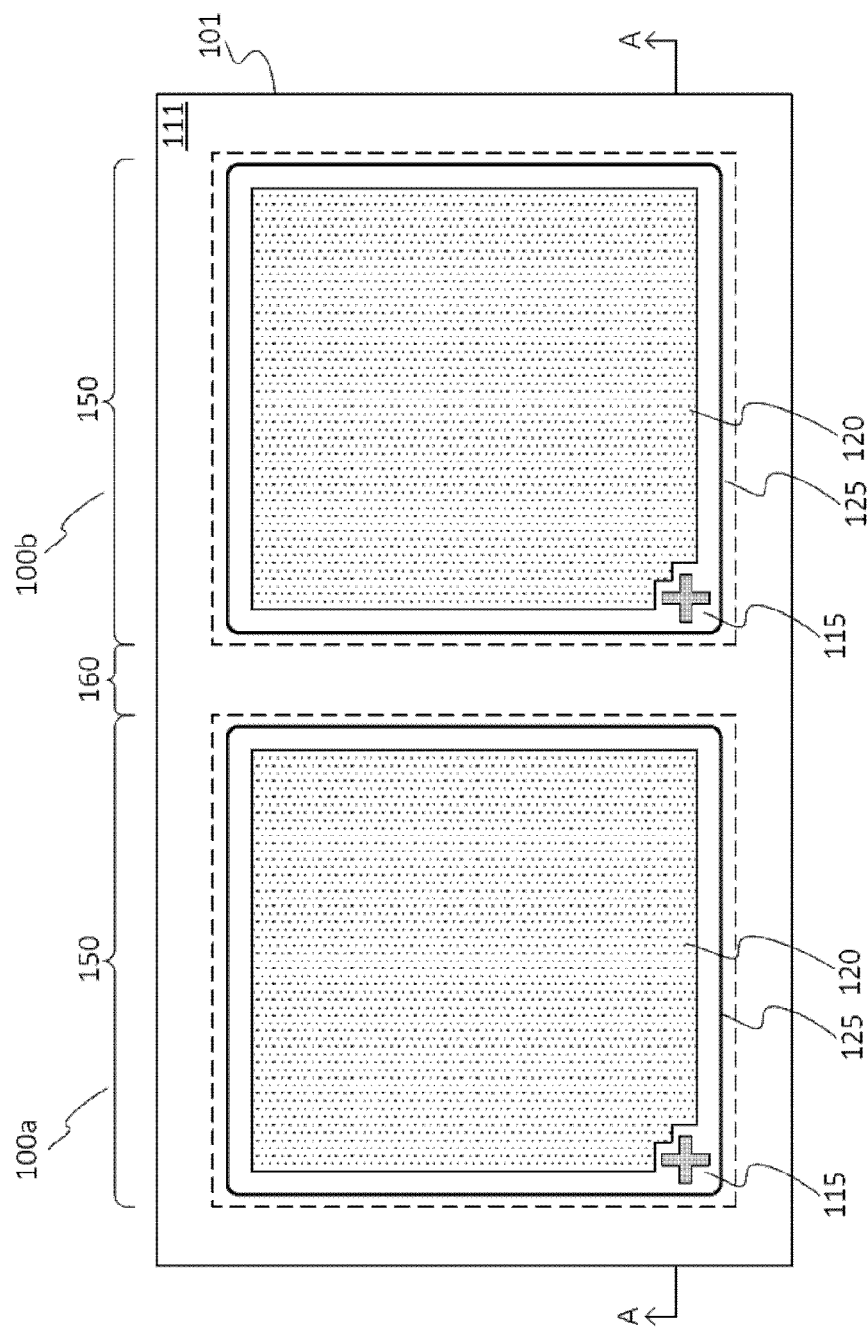

FIG. 2c illustrates a plan view of a portion of the workpiece featured in FIG. 1c. The dashed box indicates the package region 150. An alignment pattern 115 is located in each package region 150. The lighter alignment pattern 115 indicates that it is covered by layer 111, but is still visible. Additional conductive features 120 are illustrated by the textured rectangular shape. A seal ring 125 is formed around near the perimeter of the package region 150. The line AA indicates a cross section cut-line for FIG. 1c. Layer 111 is visible.

Referring to any of FIGS. 2a-2c, although one alignment pattern is located in each of the package regions for package 100a and 100b, it should be understood that multiple alignment patterns may be included. Further, the alignment pattern 115 depicted is merely an example, and other shapes can be used, as explained in greater detail below.

Figure 3A:
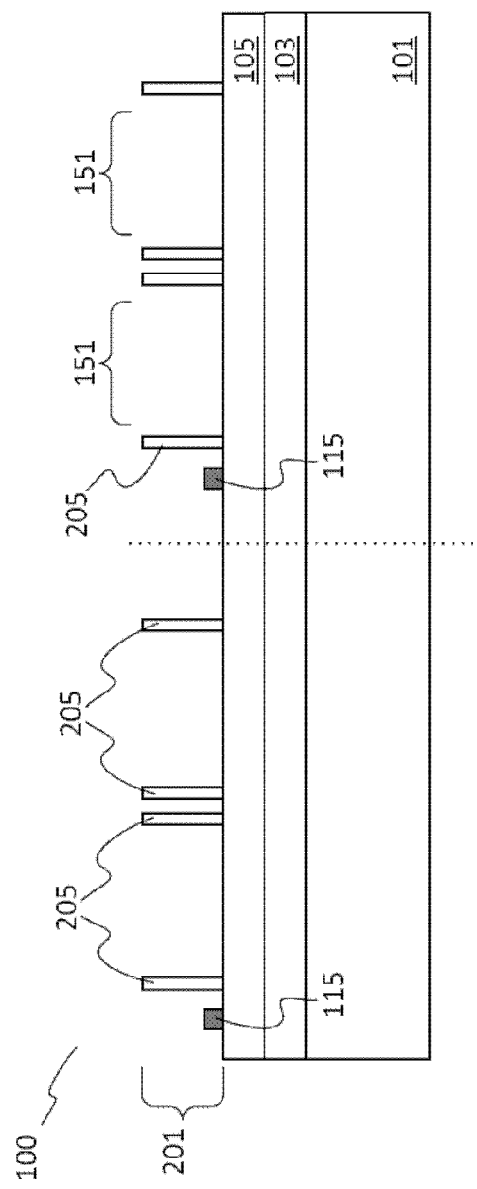

Referring further to FIG. 3a, conductive vias 205 are formed on the first insulating layer 105. In some embodiments the conductive vias 205 are formed over the first insulating layer 105 and extend from the first insulating layer 105 in a direction that is substantially perpendicular to the first side 105A (e.g., FIG. 1a) of the first insulating layer 105.

In some embodiments, a seed layer (not shown) may be interposed between the conductive vias 205 and the first insulating layer 105. In some embodiments the seed layer may comprise copper, titanium, nickel, gold, the like, or a combination thereof, and may be formed using an electrochemical plating process, ALD, PVD, sputtering, the like, or a combination thereof.

In some embodiments, a sacrificial layer is formed over the seed layer. Openings are formed in the sacrificial layer to expose portions of the seed layer disposed in the openings. In some embodiments wherein the sacrificial layer comprises a photoresist material, the sacrificial layer may be patterned using suitable photolithography methods. Conductive vias 205 can be formed in the openings by filling them with a conductive material such as copper, aluminum, nickel, gold, silver, palladium, the like, or a combination thereof using an electro-chemical plating process, an electroless plating process, ALD, PVD, the like, or a combination thereof to form conductive vias 205. After the formation of the conductive vias 205 is completed, the sacrificial layer is removed. In some embodiments wherein the sacrificial layer comprises a photoresist material, the sacrificial layer may be removed using, for example, an ashing process followed by a wet clean process. Subsequently, exposed portions of the seed layer are removed using, for example, a suitable etching process.

In some embodiments, the conductive vias 205 may be stud bumps, which are formed by wire bonding on the seed layer or on a conductive pad, and cutting the bond wire with a portion of bond wire left attached to the seed layer of the conductive pad. The upper portion of the conductive via 205 may have a uniform width and a uniform shape that are uniform throughout the top part, the middle part, and the bottom part of upper portion. The conductive vias 205 may be formed of non-solder metallic materials that can be bonded by a wire bonder. In some embodiments, the conductive vias 205 are made of copper wire, gold wire, the like, or a combination thereof, and may have a composite structure including a plurality of layers.

Figure 3B:
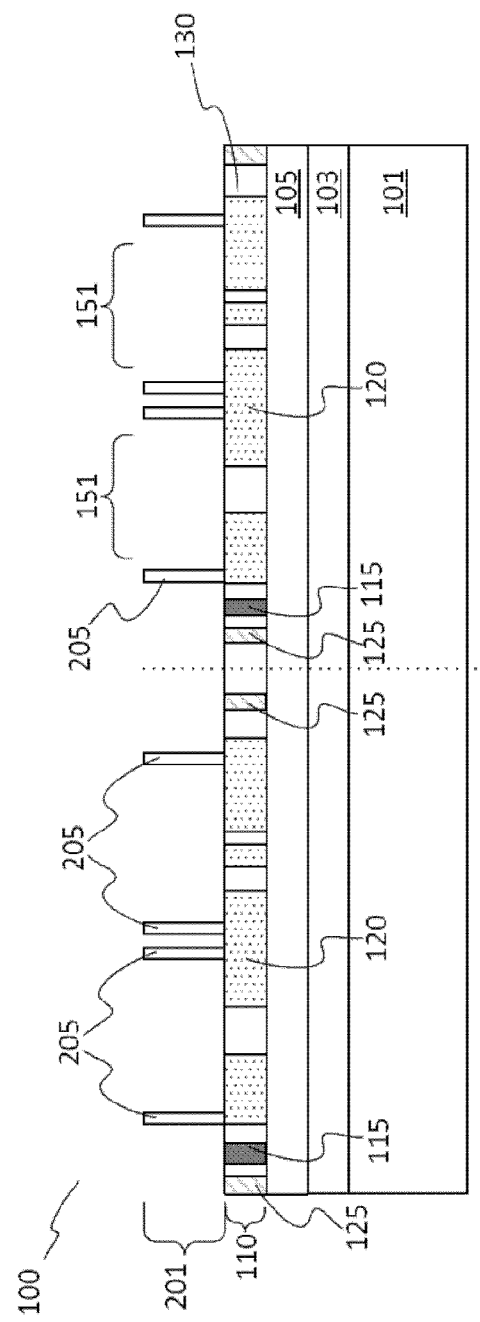

Referring to FIG. 3b, in some embodiments wherein a layer 110 is formed and includes the alignment pattern 115 and second insulting material 130, as well as other features such as conductive features 120 and seal ring 125, such as in FIG. 1b, the conductive vias 205 can be formed on the second insulating material 130 or on the conductive features 120 of layer 110. Conductive vias 205 can be formed using the processes described above with respect to FIG. 3a and is not repeated.

Figure 3C:
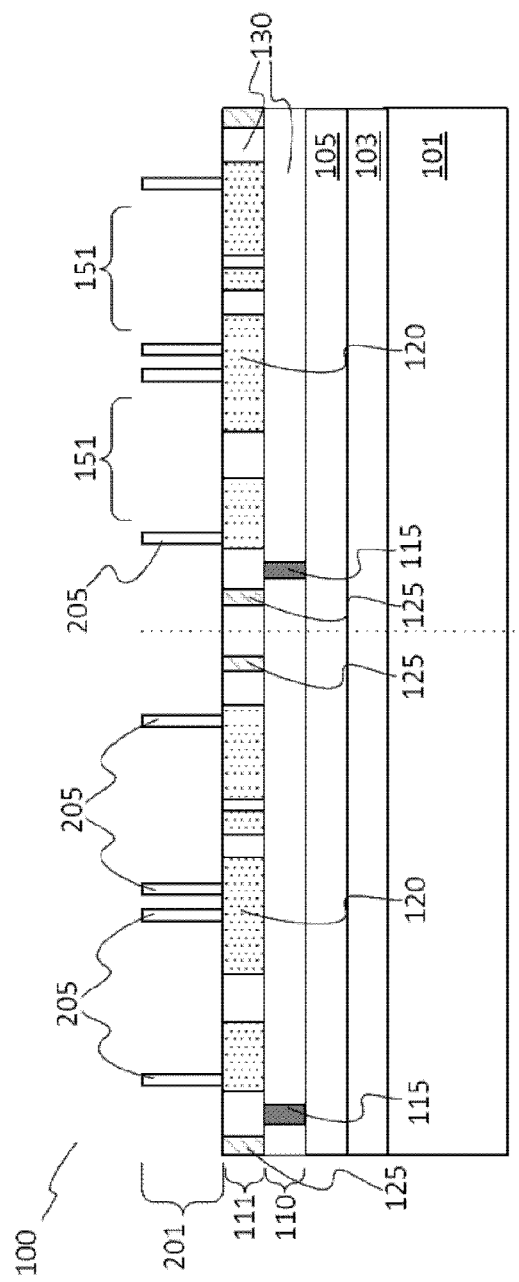

Referring to FIG. 3c, in some embodiments, wherein a layer 110 is formed and includes the alignment pattern 115 and second insulating material 130, in addition to one or more additional layers including other features such as conductive features 120, seal ring 125, or insulating material 130 in a separate layer 111, such as illustrated in FIG. 1c, the conductive vias 205 can be formed on the insulating material 130 or on the conductive features 120 of layer 111. These conductive vias 205 can be formed using the processes described above with respect to FIG. 3a and is not repeated.

Figure 4A:
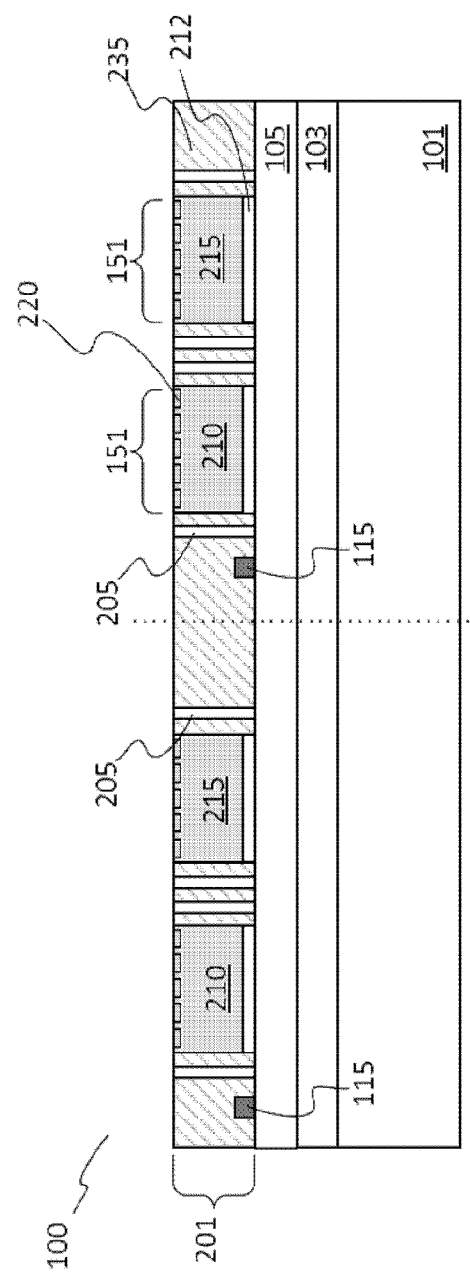

Referring to FIG. 4a, one or more integrated circuit dies 210/215 are attached to the first insulating layer 105 using adhesive layers 212. In some embodiments, the integrated circuit dies 210/215 are placed on the first insulating layer 105 using, for example, a pick-and-place apparatus. In other embodiments, the integrated circuit dies 210/215 may be placed on the first insulating layer 105 manually, or using any other suitable method. In some embodiments, the adhesive layer 212 may comprise an LTHC material, a UV adhesive, a die attach film, or the like, and may be formed using a spin-on coating process, a printing process, a lamination process, or the like.

In some embodiments, the alignment pattern 115 is used to precisely align the die(s) 210/215 on the first insulating layer 105. In embodiments using a backside RDL structure, for example, precise alignment can avoid shifting of the dies 210/215, which may cause electrical failures of the package 100a, for example. The dies 210/215 are not bonded to the alignment pattern 115 and the alignment pattern 115 is still visible from above after the dies 210/215 are attached. A first die stack includes die 210 and corresponding adhesive layer 211. A second die stack includes die 215 and corresponding adhesive layer 211. As seen in FIG. 4a, in some embodiments the bottom of the first and second die stacks can be substantially coplanar with the bottom of the alignment pattern 115. Similarly, the top of the alignment pattern 115 can be in a plane higher than the plane of the bottom of the dies 210/215 and the bottom of the first and second die stacks.

Integrated circuit dies 210/215 can include one or more dies suited for the package design. For example, dies can include a logic die 215 such as a system on chip (SoC) die, central processing unit (CPU), a graphics processing unit (GPU), or the like and/or a memory die 210 such as a DRAM memory device. In other embodiments, integrated circuit die 210/215 can be a Power Management Integrated Circuit (PMIC) die, a Transceiver (TRX) die, or the like. In some embodiments, the die(s) 110 includes a die stack (not shown) which may include both logic dies and memory dies. The die(s) 210/215 may include an input/output (I/O) die, such as a wide I/O die. Although two dies 210/215 are illustrated, it should be understood that in some embodiments only one die or more than two dies can be used.

In some embodiments, the integrated circuit dies 210/215 are mounted to the first insulating layer 105 such that die contacts 220 are facing away from or distal to the first insulating layer 105. The die contacts 220 provide an electrical connection to the electrical circuitry formed on the integrated circuit dies 210/215. The die contacts 220 may be formed on active sides of the integrated circuit dies 210/215, or may be formed on backsides and comprise through-vias. The die contacts 220 may further comprise through-vias providing an electrical connection between first sides and second sides of the integrated circuit dies 210/215. In some embodiments, the die contacts 220 may comprise copper, tungsten, aluminum, silver, gold, tin, a combination thereof, or the like. In some embodiments, the die contacts 220 may be formed using similar materials and methods as the alignment pattern 115 discussed above with reference to, for example, FIG. 1a, and the description is not repeated herein.

Still referring to FIG. 4a, an encapsulant 235 is formed over the carrier 101, and over and surrounding the integrated circuit dies 210/215, the conductive vias 205, and the alignment pattern 115. In some embodiments, the encapsulant 235 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the integrated circuit dies 210/215, the conductive vias 205, and the alignment pattern 115.

Referring further to FIG. 4a, in some embodiments, a resulting structure is planarized, for example, using a CMP process, a grinding process, the like, or a combination thereof. In some embodiments, the planarization process is performed to expose the die contacts 220 of the integrated circuit dies 210/215. In some embodiments, the top surfaces the conductive vias 205 are substantially coplanar with top surfaces of the die contacts 220 and the encapsulant 235 within process variations. The die layer 201 includes the attached dies 210/215, the encapulant 235, and the conductive vias 205.

Figure 4B:
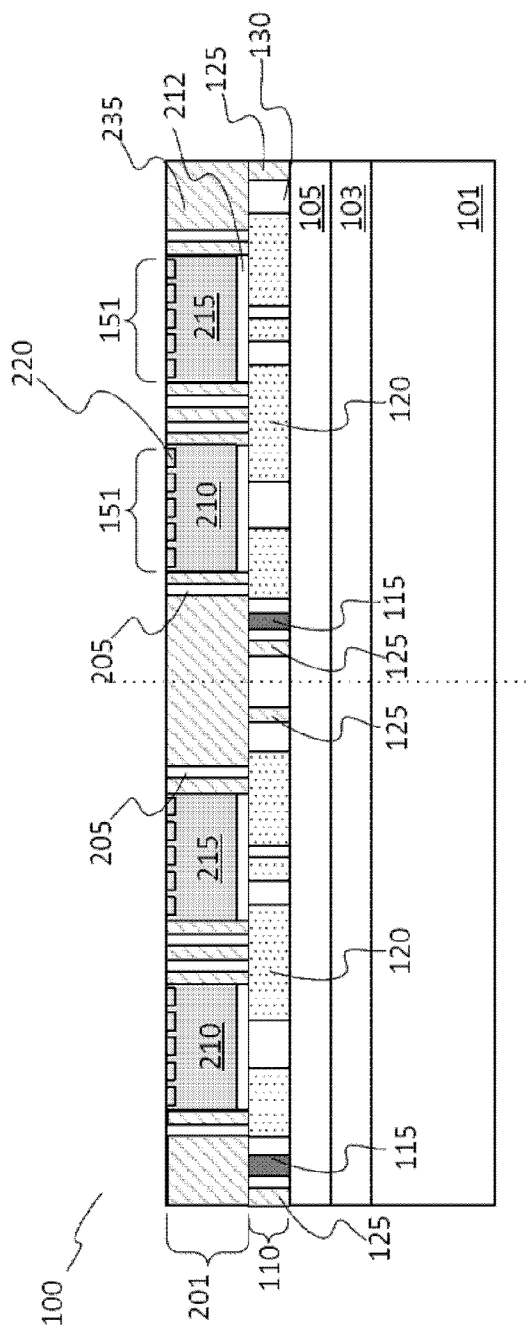

Referring to FIG. 4b, in some embodiments wherein a layer 110 is formed and includes the alignment pattern 115 and second insulting material 130, as well as other features such as conductive features 120 and seal ring 125, such as in FIG. 1b, the integrated circuit dies 210/215 can be placed on the second insulating material 130 and/or over the conductive features 120 of layer 110. The integrated circuit dies 210/215 can be placed using any of the processes described above with respect to FIG. 4a, including that the alignment pattern 115 can be used to precisely place the dies 210/215 on the layer 110.

Figure 4C:
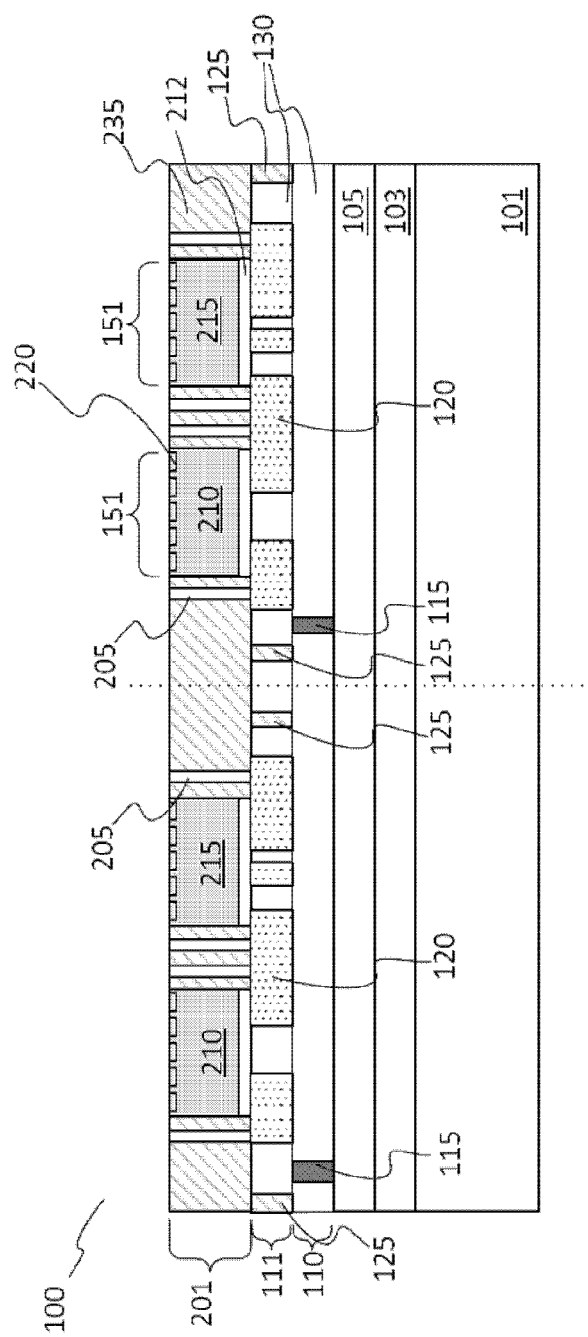

Referring to FIG. 4c, in some embodiments, wherein a layer 110 is formed and includes the alignment pattern 115 and second insulating material 130, in addition to one or more additional layers including other features such as conductive features 120, seal ring 125, or insulating material 130 in a separate layer 111, such as illustrated in FIG. 1c, the integrated circuit dies 210/215 can be placed on the insulating material 130 and/or over the conductive features 120 of layer 111. The integrated circuit dies 210/215 can be placed using any of the processes described above with respect to FIG. 4a, including that the alignment pattern 115 can be used to precisely place the dies 210/215 on the layer 111.

Referring to FIG. 4b or 4c, in some embodiments, an encapsulant 235 is formed over the carrier 101, and over and surrounding the integrated circuit dies 210/215 and the conductive vias 205. In some embodiments, the encapsulant 235 may comprise the same materials and be formed in the same way as described above with respect to FIG. 4a. A planarization process, such as a CMP process, a grinding process, the like, or a combination thereof, may be performed. In some embodiments, the planarization process is performed to expose the die contacts 220 of the integrated circuit dies 210/215. In some embodiments, the top surfaces the conductive vias 205 are substantially coplanar with top surfaces of the die contacts 220 and the encapsulant 235 within process variations.

In FIGS. 5-9, an embodiment is illustrated of the layers 110 which is consistent with the embodiment described above with respect to FIGS. 1b, 2b, 3b, and 4b. Figures and specific descriptions of the embodiments consistent with FIG. 1a or 1c have not been repeated for the sake of brevity. One of skill will understand, however, that FIGS. 5-9 can be directed to each of these embodiments by modifying the corresponding layers in a manner consistent with those embodiments.

Figure 5:
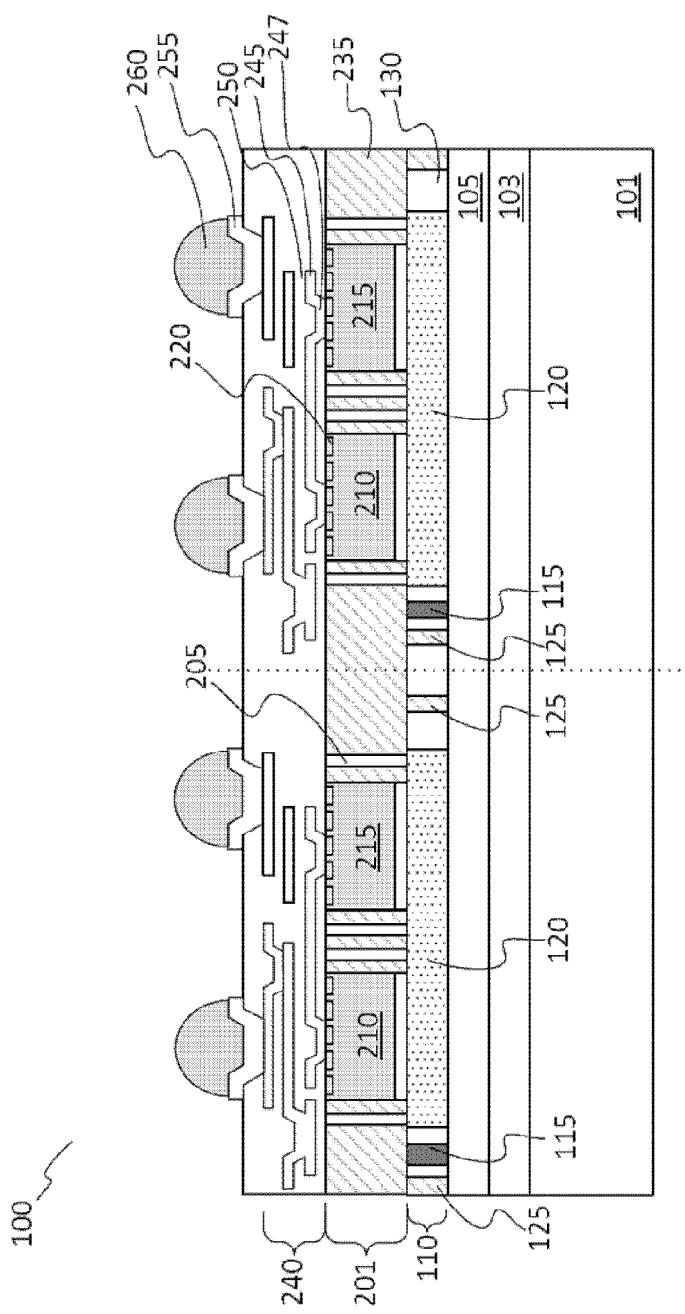

Referring to FIG. 5, a redistribution structure 240 is formed over the integrated circuit dies 210/215, the conductive vias 205 and the encapsulant 230. In some embodiments, the redistribution structure 240 comprises one or more metallization patterns 245 disposed within one or more dielectric layers 250.

The formation of redistribution structure 240 can include any appropriate method. In some embodiments, a dielectric layer 250 is deposited on the encapsulant 235, through vias 205, and die contacts 220. In some embodiments, the dielectric layer 250 is an insulating layer formed of a polymer, which may be a photo-sensitive material such as PBO, polyimide, BCB, or the like, that may be patterned using a lithography mask. In other embodiments, the dielectric layer 250 is formed of a nitride such as silicon nitride; an oxide such as silicon oxide, PSG, BSG, BPSG; or the like. The dielectric layer 250 may be formed by spin coating, lamination, CVD, the like, or a combination thereof. The dielectric layer 250 is then patterned. The patterning forms openings to expose portions of the through vias 205 and the die connectors 220. The patterning may be by an acceptable process, such as by exposing the dielectric layer 250 to light when the dielectric layer 250 is a photo-sensitive material or by etching using, for example, an anisotropic etch. If the dielectric layer 250 is a photo-sensitive material, the dielectric layer 250 can be developed after the exposure.

A metallization pattern 245 with vias 247 is formed on the dielectric layer 250. As an example to form metallization pattern 245, a seed layer (not shown) is formed over the dielectric layer 250 and in openings (corresponding to via 247) through the dielectric layer 250. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to a metallization pattern 245 in a metal layer of redistribution structure 240. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 245 and vias 247. The vias 247 are formed in openings through the dielectric layer 250 to, e.g., the through vias 205 and/or the die connectors 220.

Additional dielectric layers 250 and metallization patterns 245 can be deposited in alternating layers using the processes and materials described above.

The front-side redistribution structure 240 is shown as an example. More or fewer dielectric layers and metallization patterns may be formed in the front-side redistribution structure 240. If more dielectric layers and metallization patterns are to be formed, steps and processes discussed above may be repeated. One having ordinary skill in the art will readily understand which steps and processes would be omitted or repeated.

Still referring to FIG. 5, pads 255 are formed on an exterior side of the front-side redistribution structure 240. The pads 255 are used to couple to conductive connectors 260 and may be referred to as under bump metallurgies (UBMs) 255. In the illustrated embodiment, the pads 255 are formed through openings through the dielectric layer 250 to the metallization pattern 245. As an example to form the pads 255, a seed layer (not shown) is formed over the dielectric layer 250. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads 255. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the pads 255. In the embodiment, where the pads 255 are formed differently, more photoresist and patterning steps may be utilized.

Still referring to FIG. 5, conductive connectors 260 are formed on the UBMs 255. The conductive connectors 260 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 260 may include a conductive material such as solder, copper, aluminum, gold, nickel, silver, palladium, tin, the like, or a combination thereof. In some embodiments, the conductive connectors 260 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 260 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 260. The metal cap layer may include nickel, tin, tin-lead, gold, silver, palladium, indium, nickel-palladium-gold, nickel-gold, the like, or a combination thereof and may be formed by a plating process.

The front-side redistribution structure 240 may be utilized to couple the die package 100a, for example, via the connectors 260 to one or more packages, package substrates, components, the like, or a combination thereof.

Although only a few connectors 260 and layers of redistribution structure 240 layers are illustrated, it should be understood that these are provided merely as an example. The packages can have many connectors in a grid, array, or other arrangement, and each connector 260 may be coupled to one or more metallization patterns 245 of redistribution structure 240. Some connectors 260 can be coupled to a die contact 220. Some connectors 260 can be coupled to conductive vias 205.

Figure 6:
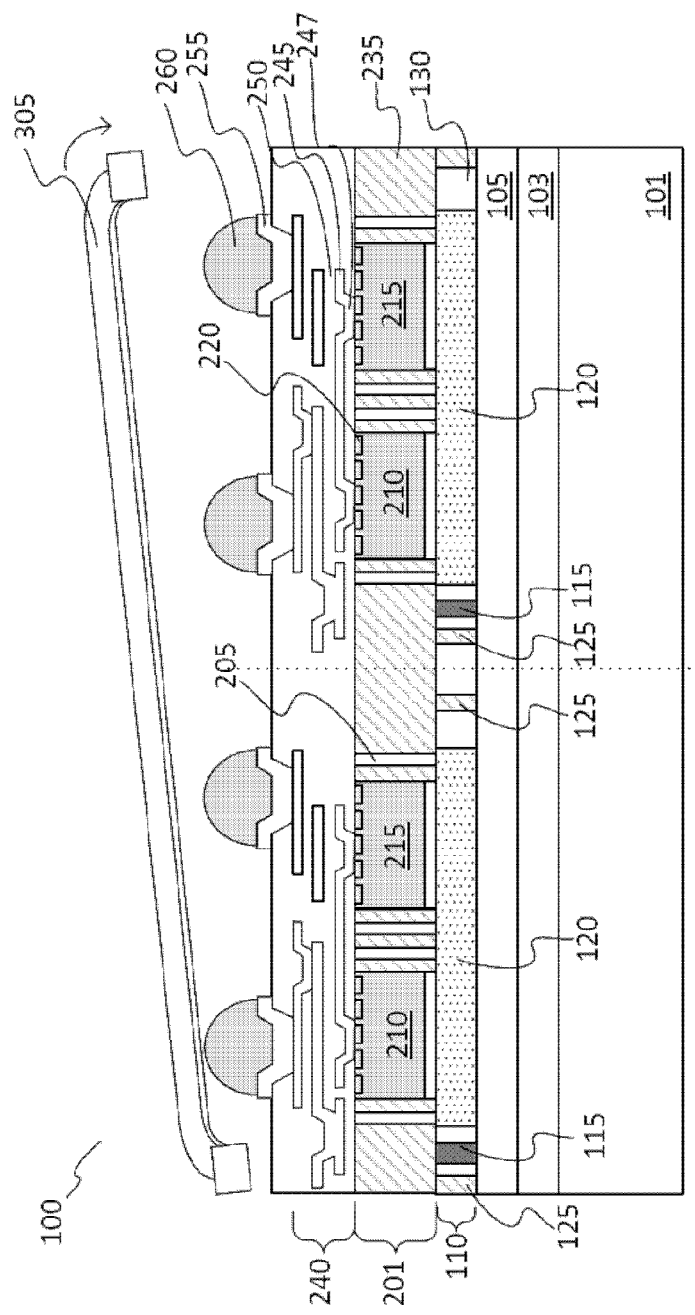

Referring to FIG. 6, a carrier tape or debond tape 305 can be applied to the connectors 260 of the packages 100. The debond tape 305 has an adhesive surface that is used to attach the electrical connectors 250 to the debond tape 305. The debond tape 305 can be attached before or after flipping the carrier 101 over.

Figure 7:
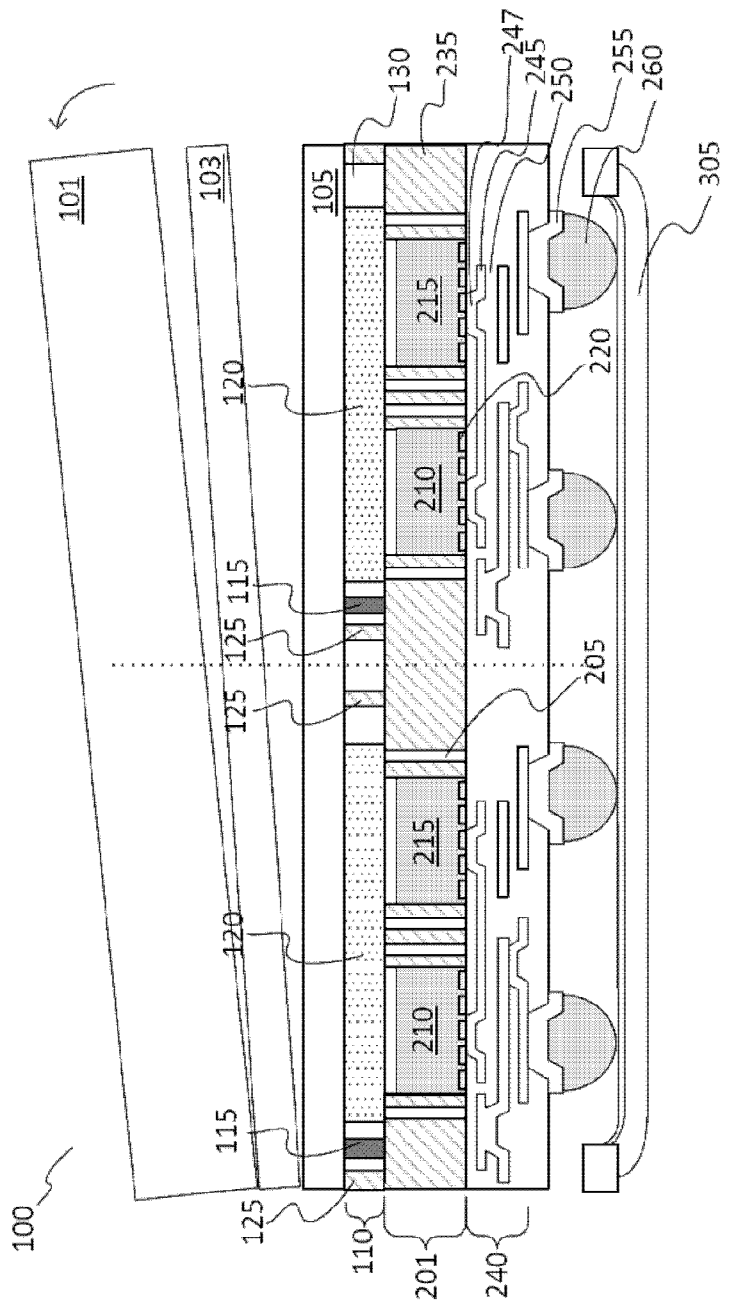

Referring to FIG. 7 the carrier 101 is removed from the backside of the packages 100. The carrier 101 can be removed by any suitable method depending on how it was attached to the package. For example, in embodiments in which the adhesive layer 103 is formed of a light-sensitive adhesive, the carrier substrate 100b can be removed by exposing adhesive layer 103 to ultraviolet light or a laser, causing it to lose its adhesive property. In some embodiments, the carrier 101 can be removed by grinding or etching. If used, adhesive layer 103 is also cleaned from the packages 100.

Figure 8:
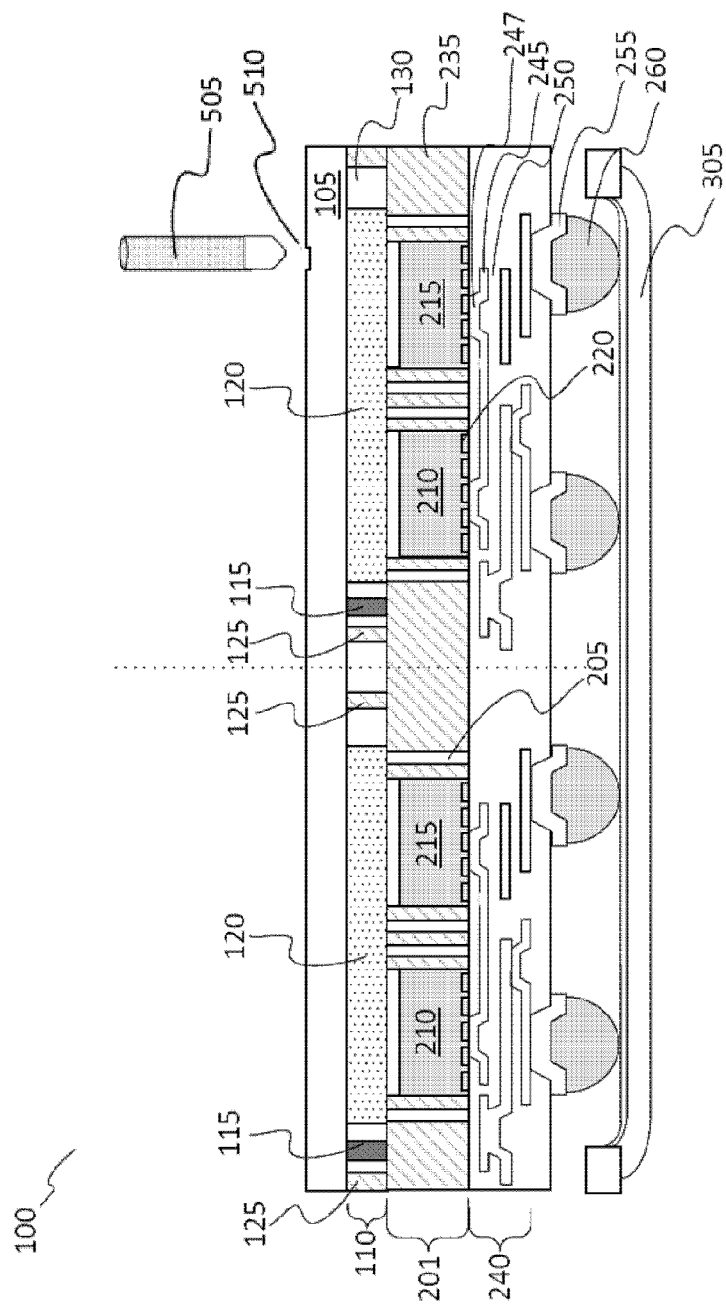

Referring to FIG. 8, the packaged devices 100 are further processed. In some embodiments, a laser marking device 505 is used to mark the backside of the device with informational marks 510. For example, the first insulating layer 105 can be marked with lot numbers, design numbers, revision numbers, logos, other markings, and so forth. Informational marks 510 can be seen as recesses in first insulating layer 105 and may carry the information for the respective package, for example, package 100a or 100b. Informational marks 510 may include letters, number, or other identifiable patterns. The laser marking device 505 can be a laser suitable for marking on the packaged device, such as a laser drill.

In some embodiments, prior to the laser marking, the first insulating layer 105 can be thinned using, for example, a grinding, CMP, or etching process. The thinning can expose the alignment pattern 115, for example if the alignment pattern was deposited in first insulating layer 105. The thinning can also expose backside contact pads which can have been included in the first insulating layer 105 in a manner similar to that described above with the alignment pattern 115. Such backside contact pads can be used to form additional connectors on the backside of the packages 100.

In some embodiments, additional processing can include forming one or more backside redistribution structures in a manner similar to and using materials such as those described above with respect to the forming of front-side redistribution structure 240. In some embodiments, additional processing of the workpiece can include mounting other devices on the backside of the packages 100, such as by a pick and place process or manual process, and coupling the other devices to the backside of the packages 100 directly or via connectors.

In the additional processing, alignment pattern 115 should not be covered with any material or devices which would block it from being seen or recognized by a cutting alignment device, which will be discussed in greater detail below.

Figure 9:
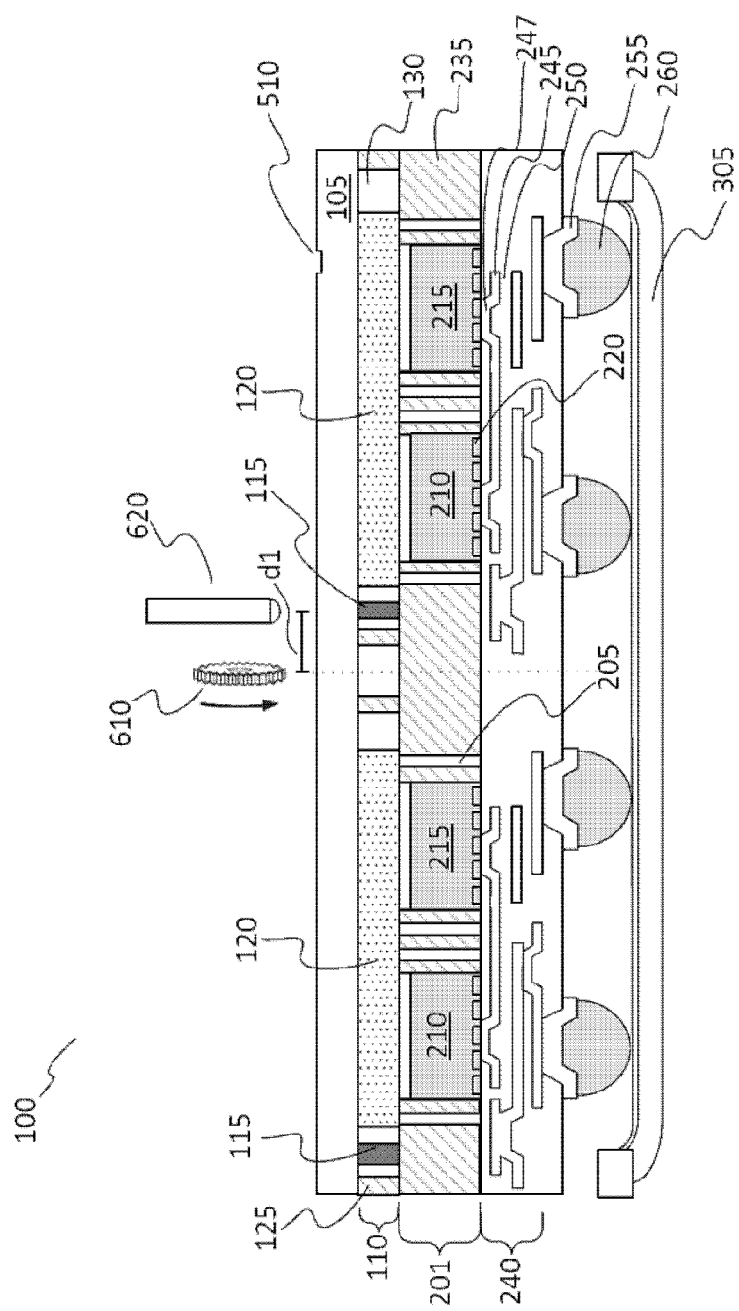

Referring to FIG. 9, the packages are cut from one another from the backside of the workpiece without turning the workpiece back over. The cut is through the non-package region 160 along the dicing streets, through first insulating layer 105, layer 110 (in accordance with some embodiments), molding material 235, and redistribution structure 240. A cutting device 610, such as a saw, can be used. In some embodiments, cutting device 610 can be another device suitable for cutting the packages, such as a cutting laser or plasma etchant. Embodiments such as those discussed herein are to be singulated from the backside of the device using alignment pattern 115 as a guide for saw alignment and using debond tape 305 as a saw tape, rather than bonding the structure to a saw tape, turned over, debonded from the debond tape, and cut from the front (connector side).

An alignment device 620 can include an optical sensor which can scan the backside of the package structure 100 over the first insulating layer 105 for a particular alignment pattern 115 and align the cutting device 610 to be a distance d1 from the alignment pattern 115. Any other suitable sensor technologies can be used for detecting the alignment pattern 115. Alignment device 620 can also determine a rotational position of the cutting device 610 based on the alignment pattern 115. For example, cutting device 610 can be aligned to cut parallel or at a respective angle to an edge of the alignment pattern 115 in plan view.

In some embodiments, a first cut can be made partially into the first insulating layer 105 to define scribe lines for a subsequent second cut to complete the singulation process of the packages 100.

Alignment device 620 can be used to recognize the alignment pattern 115 through the first insulating layer 105 and use the alignment pattern 115 to determine a distance d1 in an x and/or y direction (in top down view) from the alignment pattern 115 to cut the packages for singulation. This will be described in greater detail below. Multiple alignment patterns 115 can be included, for example, located near corners of the package region 150.

Figure 10A:
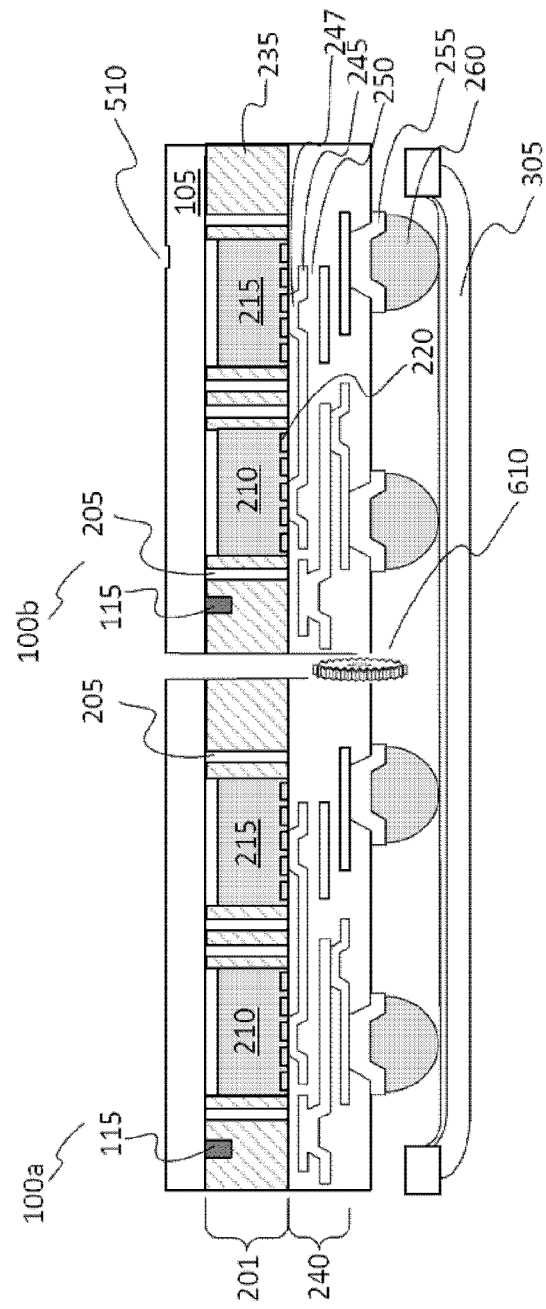

Referring to FIG. 10a, the cutting device can singulate the packages, for example, into package 100a and package 100b. The cutting device 610 cuts through the first insulating layer 105, molding compound 235, and the dielectric layers of the redistribution structure 240. In some embodiments, the cutting device 610 can also cut through the debond tape 305. In other embodiments, the cutting device 610 can stop short of cutting through the debond tape 305. Following the cutting, the debond tape is removed from the packages 100a and 100b.

The packages 100a and 100b can be used in further processing, for example by bonding another package on top or bonding to another package, interposer, or the like. In some embodiments, the packages 100a and 100b can be further processed after singulation, either prior to removing the debond tape 305 or after, for example, to add connectors, packages, or other devices, on the backside of packages 100a and 100b. In some embodiments, alignment pattern 115 can be used in further processing of the singulated packages, for example, to align other devices thereto in a package on package structure.

In FIG. 10a, alignment pattern 115 is embedded in the molding compound 235, in accordance with some embodiments, e.g., those associated with FIGS. 1a, 2a, 3a, and 4a.

Figure 10B:
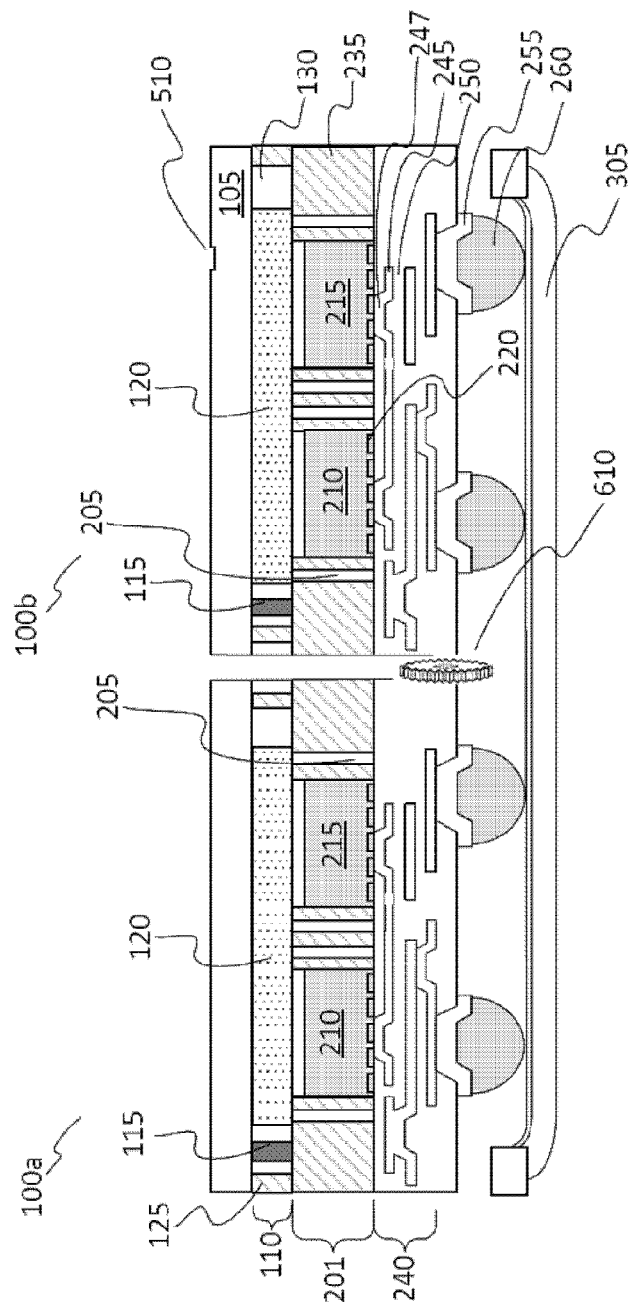

Referring to FIG. 10b, alignment pattern 115 is contained within a separate layer 110 along with second insulating material 130, in accordance with some embodiments, e.g., those consistent with FIGS. 1b, 2b, 3b, and 4b. The cutting device 610 cuts through the first insulating layer 105, layer 110, molding compound 235, and the dielectric layers of the redistribution structure 240. The rest of the singulation process is the same as described above with respect to FIG. 10*a* and is not repeated.

Figure 10C:
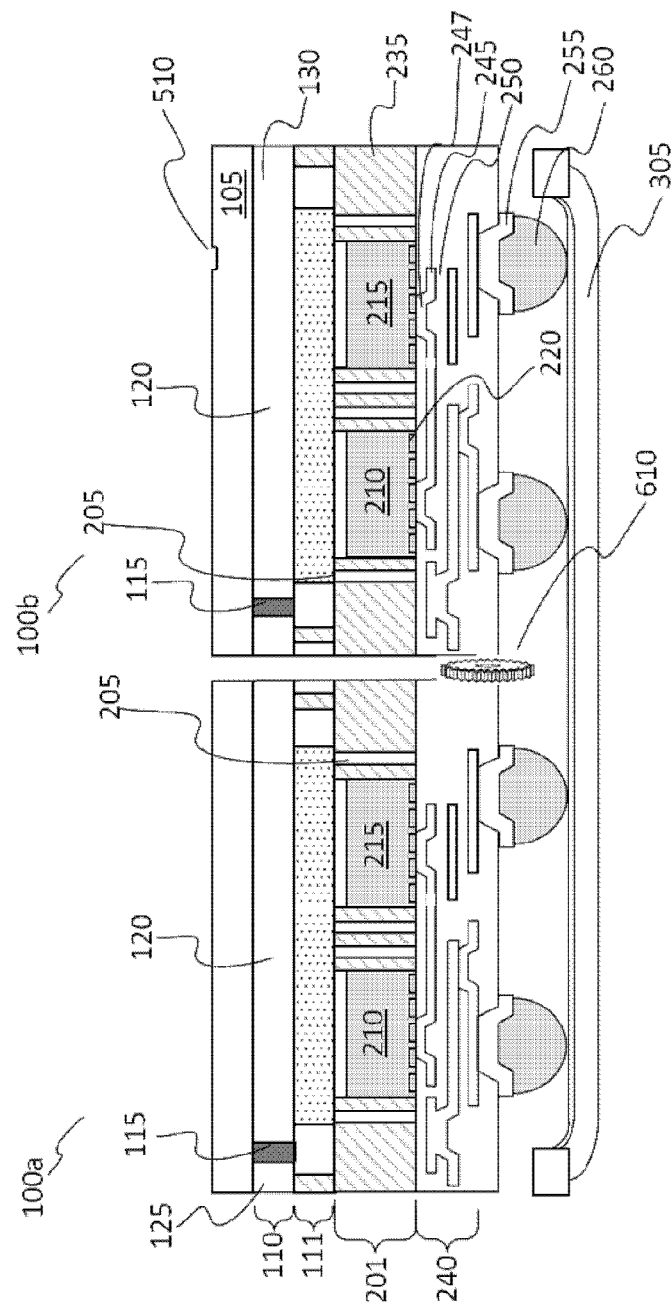

Referring to FIG. 10*c*, alignment pattern 115 is contained within a separate layer 110 along with second insulating material 130, in accordance with some embodiments, e.g., those consistent with FIGS. 1*c*, 2*c*, 3*c*, and 4*c*. The cutting device 610 cuts through the first insulating layer 105, layer 110, additional layers 111, molding compound 235, and the dielectric layers of the redistribution structure 240. The rest of the singulation process is the same as described above with respect to FIG. 10*a* and is not repeated.

Referring to FIGS. 10*a*-10*c*, if other layers have been included which are not specifically addressed herein, such as a layer resulting from further processing of the backside of the packages, such as discussed with respect to FIG. 8, then those layers will also be cut through by cutting device 610 in the singulation process.

Figure 11:
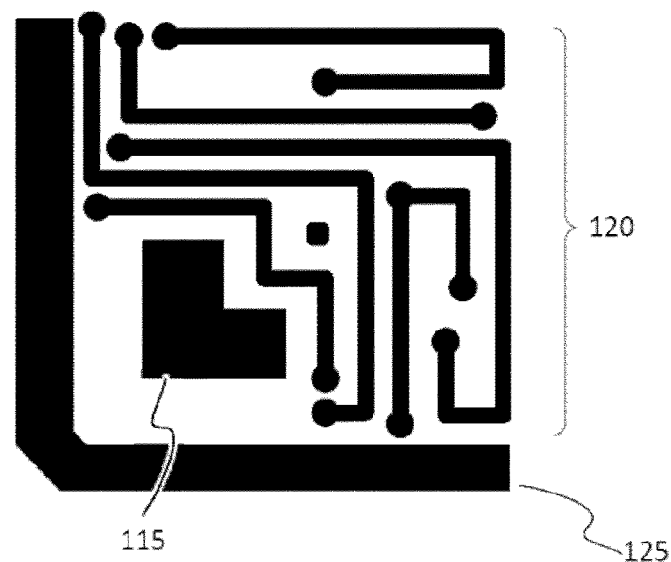
FIG. 11 illustrates a top down view of the backside of an InFO package alignment pattern, in accordance with some embodiments.

Referring to FIG. 11, a top down view of the backside of a corner portion of an InFO package is illustrated, in accordance with some embodiments. Alignment pattern 115 is visible through first insulating layer 105, which contains conductive features 120, such as trace routing or contacts. The conductive features 120 can couple to dies and other contacts or connectors in the package. In some embodiments, conductive features 120 can include an ornamental design or pattern. In some embodiments, conductive features 120 can include a shield. An optional seal ring 125 can be formed around the design, enclosing the design within the seal ring 125 in plan view. The seal ring 125 is considered to be in the design area of the package region 150.

Figure 12:
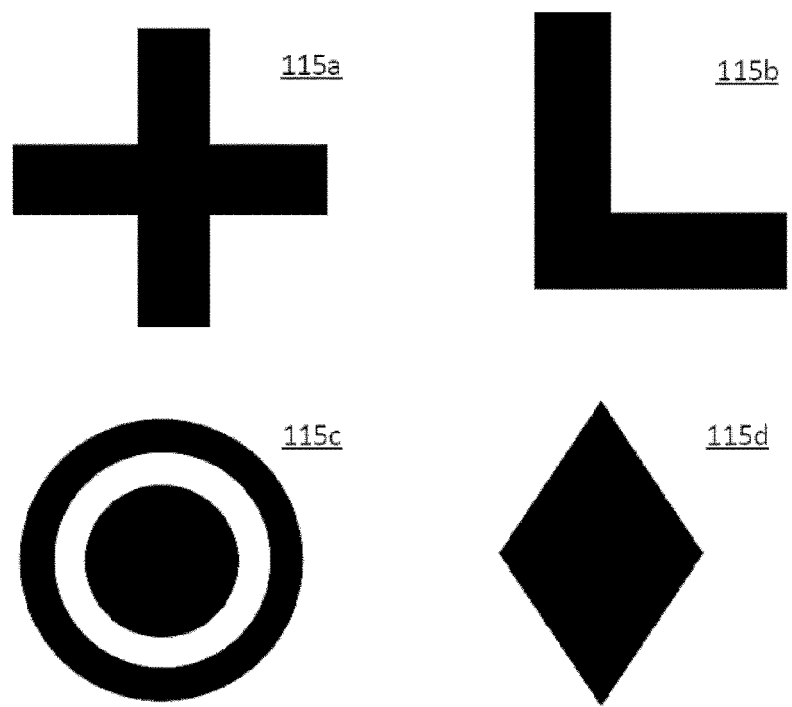
FIG. 12 illustrates alignment pattern shapes, in accordance with some embodiments.

Referring to FIG. 12 possible alignment pattern designs are illustrated, in accordance with some embodiments. FIG. 12 illustrates a cross shape 115*a*, el-shape 115*b*, bullseye 115*c*, and a diamond 115*d*. These are only some examples of marks that can be used. Any shape can be used as an alignment pattern 115. The shape of alignment patterns 115*a*, 115*b*, 115*c*, and 115*d* are provided for illustrative purposes only and are not meant to limit the scope of the embodiments described herein.

Figure 13:
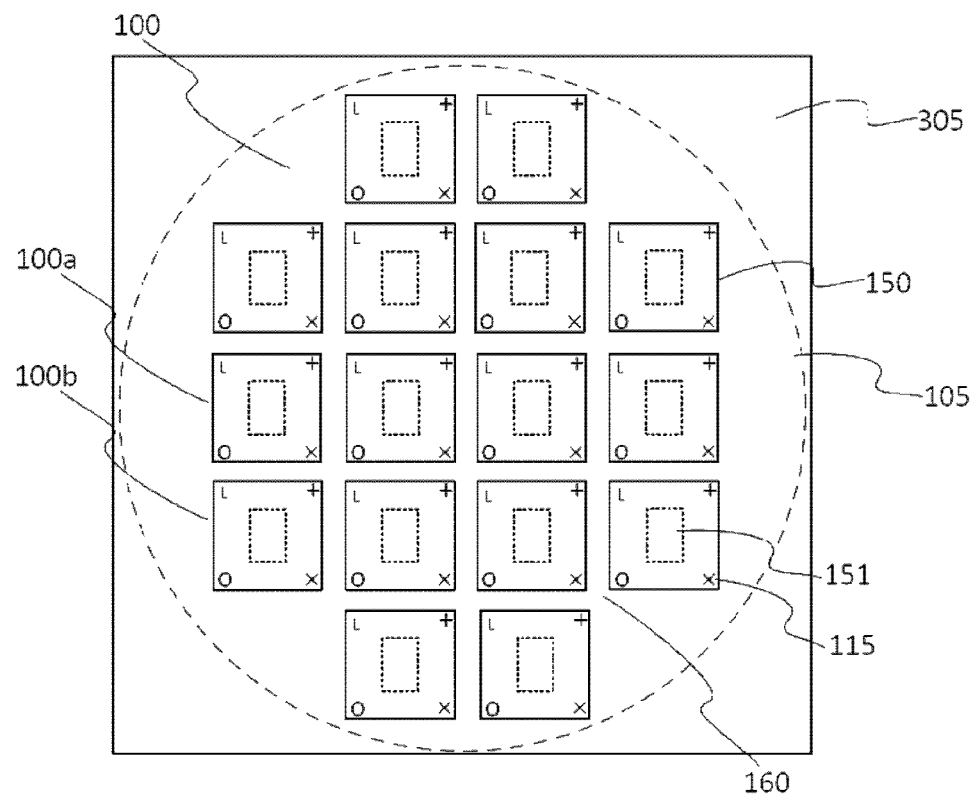
FIGS. 13-15 illustrates top down views of the backside of an InFO package, in accordance with some embodiments.

Referring to FIG. 13, a top down view of packages 100 prior to singulation is illustrated, in accordance with some embodiments. A circle shown in phantom represents a carrier wafer 101 that has been removed. Multiple packages 100 are mounted to a debonding/saw tape 305 by their connectors 260 (not shown). For example, individual packages 100*a* and 100*b* are illustrated. Each packages has one or more die mounting regions 151 illustrated by the dashed rectangle. One or more alignment patterns 115 are included in the package area 150. A non-package area 160 is located between the individual packages 100, thereby defining dicing streets. As illustrated in FIG. 13, multiple alignment patterns 115 can be included in each package. Although it is illustrated that four different marks are included in each package, alignment patterns 115 can each be identical to each other, set in pairs, or set in any other arrangement of similar or dissimilar marks. Fewer or more alignment patterns can be included as well. For example, one or more alignment patterns 115 can be included as visible in the top down view. Alignment patterns 115 need not be placed in corners of the packages, but can be anywhere within the package. Alignment patterns 115 can be included outside the die mounting region 151, as illustrated, or in some embodiments, can be included inside the die mounting region 151, if including it would not interfere with the ability of alignment device 620 to scan the surface and find the alignment patterns 115.

Figure 14:
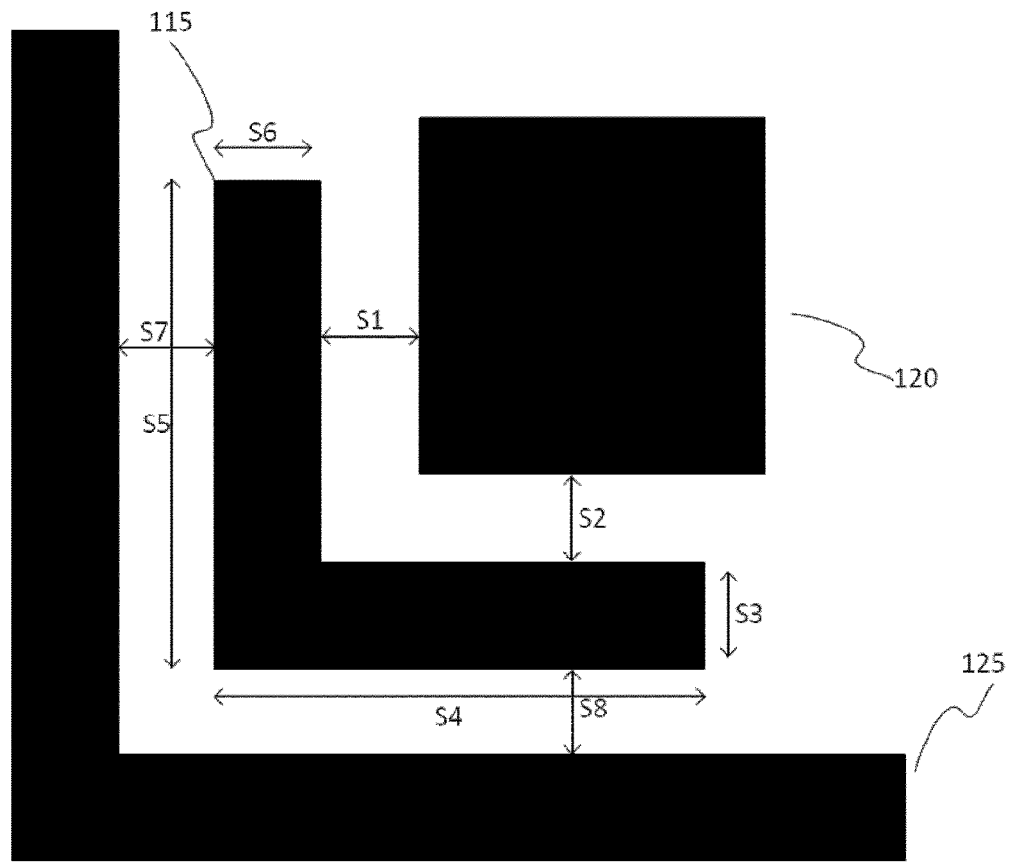

FIG. 14 illustrates dimensions of an alignment pattern 115, in accordance with some embodiments. Conductive features 120 can be visible from the top down view, for example, in layer 110 or in an additional layer 111. The alignment pattern 115 can be a minimum specified distance S1 in a first dimension away from the conductive features 120 and a minimum specified distance S2 in a second dimension away from the conductive features 120. In some embodiments, the minimum distance S1 and S2 can be about 30 μm or more. In some embodiments, the minimum distance can be less than 30 μm, such as about 20 μm. Having a minimum distance can help the optical sensor of alignment device 620 distinguish between alignment pattern 115 and conductive features 120. In some embodiments the minimum specified distance S1 is the same as the minimum specified distance S2. In other embodiments, the distances S1 and S2 are different.

In some embodiments, seal ring 125 can be visible from the top down view, for example, in layer 110 or in an additional layer 111. The alignment pattern 115 can be a minimum specified distance S7 in the first dimension away from the seal ring 125 and a minimum specified distance S8 in the second dimension away from the seal ring 125. In some embodiments, the minimum distance S7 and S8 can be about 30 μm or more. In some embodiments, the minimum distance can be less than 30 μm, such as about 20 μm. In some embodiments the distance S7 is the same as the distance S8. In other embodiments, the distances S7 and S8 are different. In some embodiments the distances S1, S2, S7, and S8, are the same. In other embodiments, on or more of S1, S2, S7, and S8 can be different from the others. In some embodiments, the distances S1, S2, S7, and S8 may be less than about 30 μm.

Still referring to FIG. 14, the alignment pattern 115 is shown as an el-shape, but it can be any alignment shape, such as discussed above with respect to FIG. 12. The dimensions S3 and S6 represent a minimum width for the alignment pattern 115 in the second dimension (y-direction) and the first dimension (x-direction), respectively. In some embodiments, the minimum width of the alignment pattern 115 is about 40 μm up to about the maximum width, which is discussed below. In some embodiments, the minimum width of the alignment pattern can be less than 40 μm, such as about 10 μm. The dimensions S4 and S5 represent a maximum width for the alignment pattern 115 in the x-direction and y-direction, respectively. The maximum width is only limited by the alignment pattern 115 used and the overall width of the package area 150. In other words, the maximum dimensions of alignment pattern 115 correspond to the dimensions of the package area 150. For example, alignment pattern 115 can be 1000 μm or more in either dimension.

Figure 15:
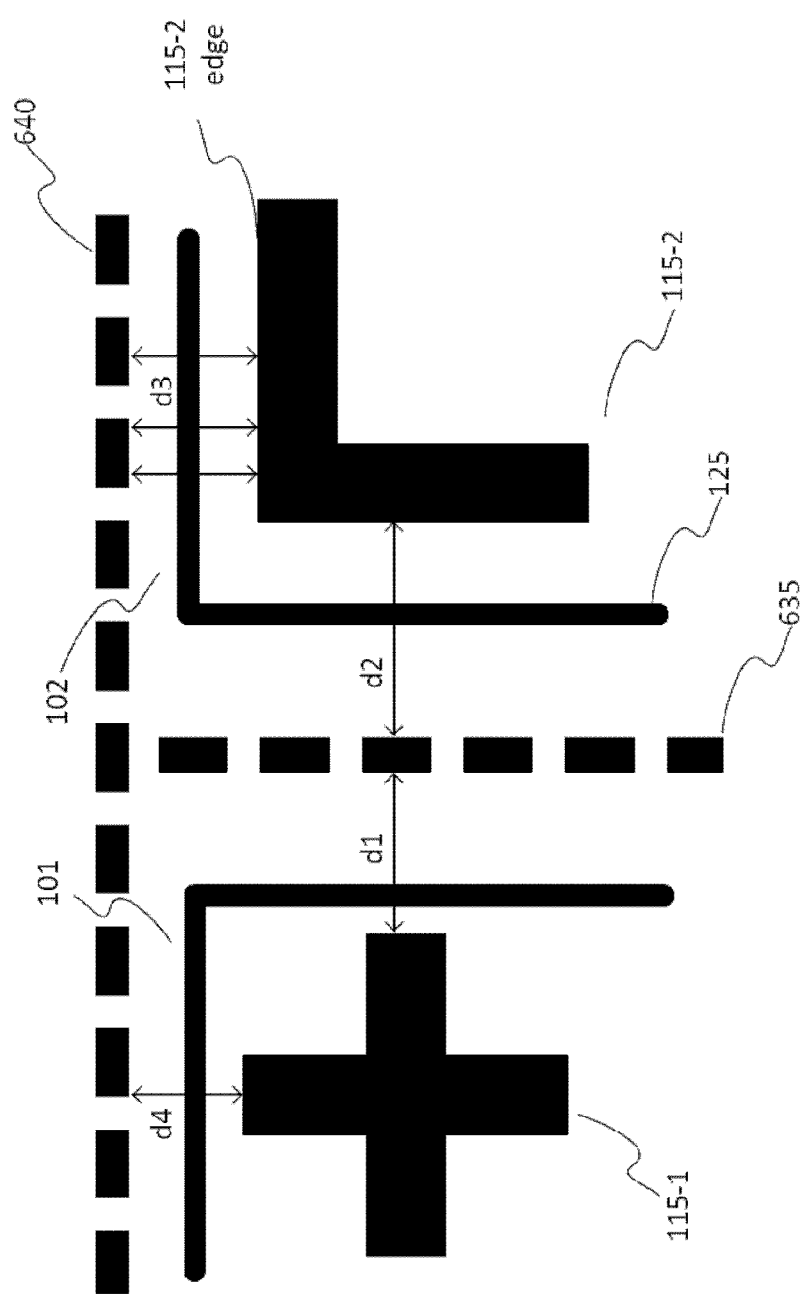

FIG. 15 illustrates a top down view of alignment pattern 115-1 and 115-2 in packages 100*a* and 100*b*, respectively. The distance d1 is measured between the alignment pattern 115-1 and a cut-line 635. The distance d2 is measured between the alignment pattern 115-2 and the cut-line 635. The distance d3 is measured between the alignment pattern 115-2 and the cut-line 640. The distance d4 is measured between the alignment pattern 115-1 and the cut-line 640. The distances d1, d2, d3, and d4 can be predetermined such that once the optical sensor of alignment device 620 detects the alignment pattern 115, the cut-line 635/640 can be determined by measuring a distance from the alignment pattern 115. In some embodiments, cut-line 640 can be determined by being a distance from alignment pattern 115-2, such as measurements d3, such that the cutline 640 is parallel to an edge (115-2 edge) of the pattern 115-2. In some embodiments, the distances from the alignment pattern 115 to the cut-line 635/640, for example d1 and d2, can be substantially equal. In some embodiments, the distances from the alignment pattern 115 to the cut-line 635/640 can be different. The alignment patterns 115-1/115-2 in adjacent packages can be the same or different, as illustrated.

In some embodiments, a single alignment pattern in one package can determine the cut-line 635 and the cut-line 640. In some embodiments, alignment pattern 115-1 can be used to determine a horizontal cutline 640 and alignment pattern 115-2 can be used to determine a vertical cutline 635, or vice versa. In some embodiments, multiple alignment patterns 115-1/115-2 can be used to determine both cut-line 635 and 640.

Figure 16:
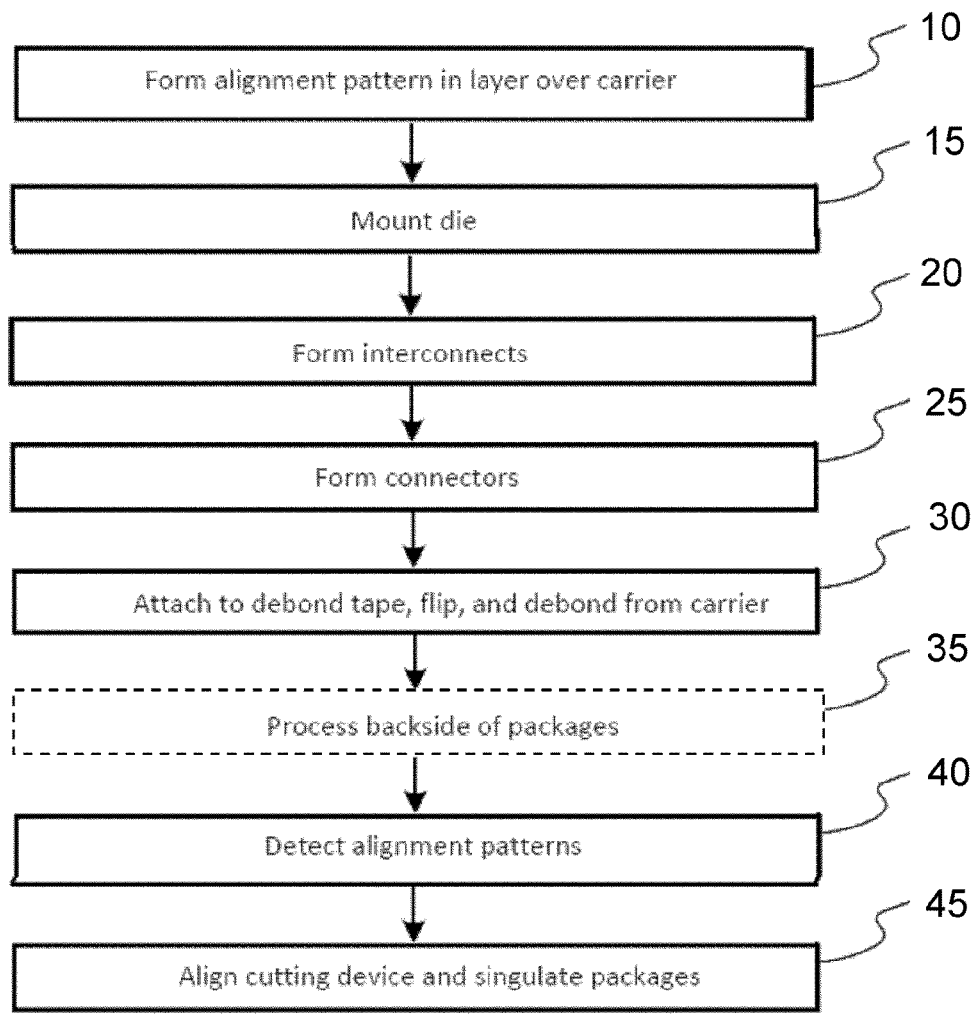
FIGS. 16-17 are flow diagrams of methods of creating or using an alignment pattern, in accordance with some embodiments.

FIG. 16 illustrates a flow diagram for providing an alignment pattern, in accordance with some embodiments. The particulars of each step are described in detail above, and are not repeated here. At 10, an alignment pattern can be formed in a layer over a carrier. As described above, an adhesive layer can be used between the alignment pattern and the carrier. Also, other features, such as conductive features or seal rings can be formed in the same layer as the alignment pattern or in a different layer. At 15, one or more dies are mounted, as described above. Vias can also be added and a molding material can be used to fill in gaps and provide structural support to the layer. At 20, interconnects can be formed over the dies, including a redistribution layer. At 25, connectors can be formed on the package over the redistribution layer.

At 30, the packages can be attached to a debond or saw tape, flipped over, and debonded from the carrier. In some embodiments, the debonding can occur before the flipping. With the backside of the packages now facing up, the backside can optionally be processed at 35. For example, the backside can be thinned or connectors can be added to the backside, possibly for mounting another package to the backside. As described above, the backside can be marked with a laser marking device. At 40, a sensor is used to detect the alignment patterns by scanning the backside of the packages. At 45, a cutting device is aligned to the alignment patterns by a predetermined offset and the packages are singulated into individual packages. The individual packages may then be further processed and incorporated, for example, into other packages or devices.

Figure 17:
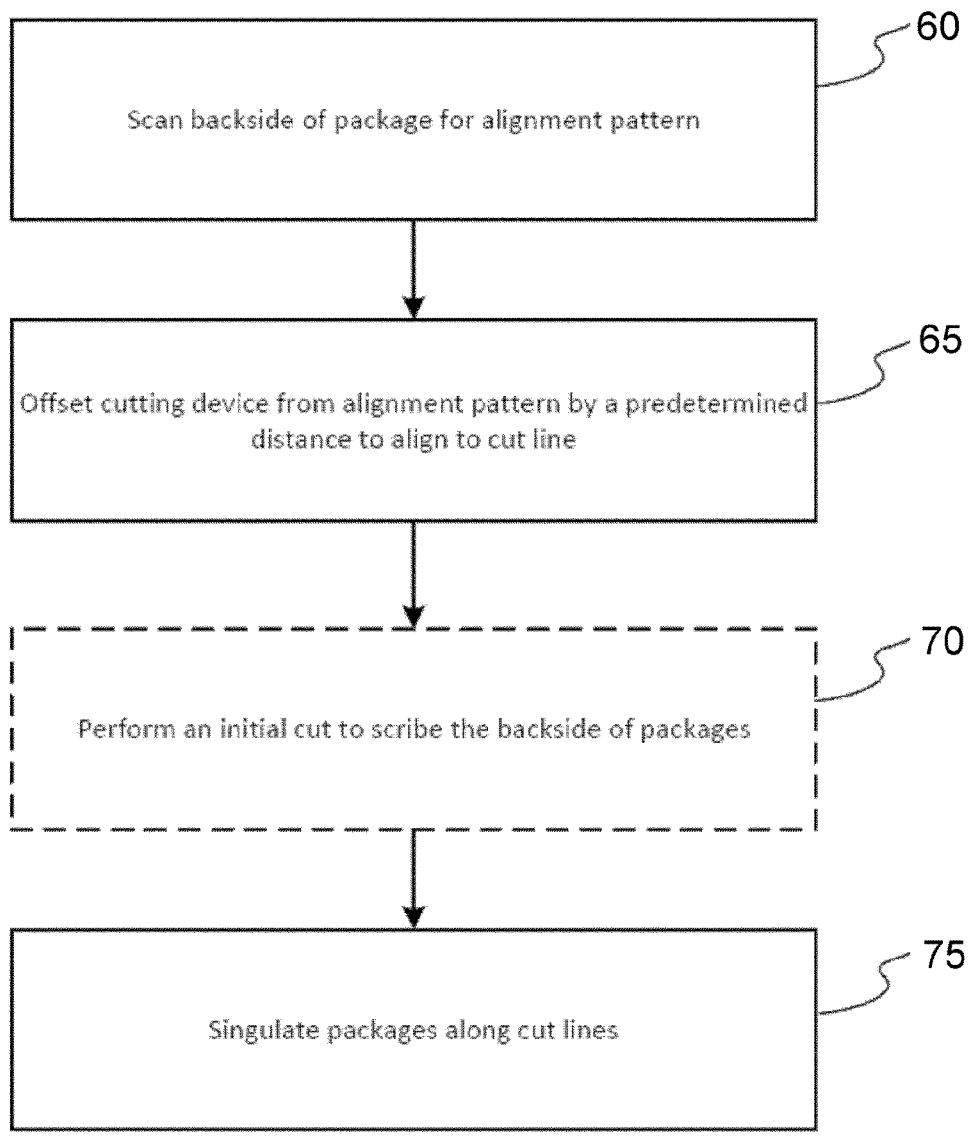

FIG. 17 illustrates a flow diagram for singulating packages where the packages have an alignment pattern formed within a visible layer of the backside of the package within a design area of the package. At 60, an alignment device with an optical sensor is used to scan the backside of the packages looking for alignment patterns. Using the alignment patterns, the alignment device determines where to cut the backside of the device. At 65, the cut-line can be determined by measuring a predetermined offset distance from the alignment pattern to the cut-line. The cutting device will cut along the cut-line.

At 70, an optional initial cut can be performed to scribe the backside of the packages. In some embodiments, the initial cut can be performed to establish the scribe lines and then subsequent processing performed thereafter. For example, connectors can be formed over the packages or other devices or packages mounted to the packages. At 75, the packages can be singulated along the cut-lines (or scribe-lines if an initial cut was made at 70). In some embodiments multiple cutting devices and/or multiple different types of cutting devices can be used to perform the singulation. For example, a combination of cutting with a saw, plasma etch, or laser can be used.

In embodiments where an initial cut was made, the initial cut and singulation cut can be made by the same or different cutting devices. For example, the initial cut can be made by a first cutting device, such as a laser, and the full singulation can be made by a second cutting device, such as a saw. Any combination of cutting devices can be used.

In some embodiments, the singulated packages may be further processed after singulation, either prior to removing the debond tape or after, for example, to add connectors, packages, or other devices, on the backside of the packages. In some embodiments, the alignment patterns of the singulated packages can be used in further processing of the singulated packages, for example by aligning another package on top or bonding to another package, interposer, or the like.

Embodiments provide an alignment pattern for aligning a cutting device to cut-lines to singulate packages, such as InFO packages. Rather than turning the packages over and singulating from the front side of the packages, the packages can be singulated from the backside of the packages, thereby saving several processing steps in forming a plurality of packages on a carrier.

One embodiment includes a method which includes forming a first insulating layer over a carrier. An alignment pattern is formed proximate a front side of the first insulating layer. A die is mounted over the front side of the first insulating layer. The die is encapsulated with an encapsulant. Connectors are formed over the die, the connectors being coupled to the die. The connectors are attached to a dicing tape and the carrier is removed. A cutting device is aligned to a backside of the first insulating layer using the alignment pattern. The first insulating layer and encapsulant are cut from the backside of the first insulating layer.

Another embodiment includes a method which includes scanning a backside of a packages structure for an alignment pattern. An alignment pattern is detected in a first package area of the packages structure. A cutting device is aligned to a cut-line in a non-package area of the packages structure based on a predetermined distance from the alignment pattern. One or more packages are singulated from the packages structure.

Another embodiment is an integrated fan-out (InFO) package which includes a first insulating layer having a first laser marking. An alignment pattern is proximate to the first insulating layer. An encapsulated die is over the first insulating layer and a redistribution structure is over the die. A plurality of connectors is disposed over the redistribution structure on a top of the package, where a first connector of the plurality of connectors is electrically coupled to the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first insulating layer over a front side of a carrier;
   forming an alignment pattern proximate a front side of the first insulating layer, the alignment pattern disposed in a corner of a design area of a package, wherein the design area is interposed between two parallel adjacent dicing lanes;
   forming a seal ring around the design area, the seal ring being laterally separated from the alignment pattern;
   mounting a die over the front side of the first insulating layer;
   encapsulating the die with an encapsulant;
   forming connectors over the die, the connectors coupled to die connectors;
   attaching a dicing tape to the connectors;
   removing the carrier;
   aligning a cutting device to a backside of the first insulating layer using the alignment pattern; and
   cutting the first insulating layer and the encapsulant from the backside of the first insulating layer.

2. The method of claim 1, further comprising:
   forming a conductive feature over the front side of the carrier, wherein a distance between the conductive feature and the alignment pattern is less than about 30 µm.

3. The method of claim 1, wherein the alignment pattern is embedded in the first insulating layer.

4. The method of claim 1, wherein the encapsulant extends along sidewalls of the alignment pattern.

5. The method of claim 1, further comprising:
   prior to forming the connectors, forming a redistribution structure over the die and the encapsulant, wherein the connectors are disposed over the redistribution structure.

6. The method of claim 1, wherein the alignment pattern has a width less than about 40 µm in at least the x-direction or the y-direction in plan view.

7. The method of claim 1, further comprising forming an informational mark with a laser on a back side of the first insulating layer.

8. A method, comprising:
   attaching a first side of a packages structure to a dicing tape by connectors disposed on the first side of the packages structure;
   scanning a second side of the packages structure for an alignment pattern;
   detecting the alignment pattern in a first package area of the packages structure, the first package area comprising an embedded die and a redistribution structure disposed between the embedded die and the connectors, the alignment pattern overlapping a metal feature of the redistribution structure;
   aligning a cutting device to a cut-line in a non-package area of the packages structure based on a predetermined distance from the alignment pattern; and
   singulating one or more packages from the packages structure, wherein a first package of the one or more packages includes the first package area and the alignment pattern.

9. The method of claim 8, further comprising:
   prior to singulating the one or more packages, scribing the backside of the packages structure with an initial cut.

10. The method of claim 8, wherein the alignment pattern is less than about 30 µm in plan view from any visible conductive feature.

11. The method of claim 8, wherein the alignment pattern has a dimension less than about 40 µm in at least one direction in plan view.

12. The method of claim 8, wherein the alignment pattern has a shape of a cross, el, diamond, bulls-eye, or box, in plan view.

13. A integrated fan-out (InFO) package comprising:
    a first insulating layer having a first laser marking;
    an alignment pattern proximate to a front side of the first insulating layer;
    an encapsulated die over the front side of the first insulating layer and encapsulated by an encapsulant;
    a redistribution structure over the die, the redistribution structure including a metal feature, wherein the alignment pattern overlaps with the metal feature of the redistribution structure, and wherein the encapsulant is interposed between the alignment pattern and the redistribution structure; and
    a plurality of connectors disposed over the redistribution structure on a top of the package, a first connector of the plurality of connectors being electrically coupled to the encapsulated die.

14. The InFO package of claim 13, wherein the alignment pattern is embedded in the first insulating layer.

15. The InFO package of claim 13, wherein the alignment pattern is embedded in the encapsulant of the encapsulated die.

16. The InFO package of claim 13, further comprising:
    a conductive trace in a same layer as the alignment pattern, the conductive trace electrically coupled to a second connector of the plurality of connectors.

17. The InFO package of claim 16, further comprising a via extending through the encapsulant, the via electrically coupling the redistribution structure to the conductive trace.

18. The InFO package of claim 13, further comprising:
    a seal ring around a periphery of the package, wherein the alignment pattern is within the seal ring.

19. The InFO package of claim 13, wherein the alignment pattern is laterally separated from the die.

20. The InFO package of claim 13, further comprising:
    a plurality of conductive features adjacent to the alignment pattern, wherein the alignment pattern is at least about 30 µm laterally from each of the plurality of conductive features, and wherein the alignment pattern is at least about 40 µm in a horizontal dimension and at least about 40 µm in a vertical dimension in top down view.

* * * * *